(12) United States Patent
Aspar et al.

(10) Patent No.: US 7,713,369 B2
(45) Date of Patent: May 11, 2010

(54) DETACHABLE SUBSTRATE OR DETACHABLE STRUCTURE AND METHOD FOR THE PRODUCTION THEREOF

(75) Inventors: Bernard Aspar, Rives (FR); Hubert Moriceau, Saint-Egreve (FR); Marc Zussy, Grenoble (FR); Olivier Rayssac, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/468,223

(22) PCT Filed: Apr. 11, 2002

(86) PCT No.: PCT/FR02/01266

§ 371 (c)(1),
(2), (4) Date: Apr. 30, 2004

(87) PCT Pub. No.: WO02/084721

PCT Pub. Date: Oct. 24, 2002

(65) Prior Publication Data

US 2005/0029224 A1      Feb. 10, 2005

(30) Foreign Application Priority Data

Apr. 13, 2001   (FR) .................................. 01 05129

(51) Int. Cl.
*B32B 38/10*       (2006.01)

(52) U.S. Cl. ..................... 156/249; 156/344; 438/455; 438/458

(58) Field of Classification Search .................. 156/239, 156/344, 584, 249; 438/455, 458
See application file for complete search history.

(56) References Cited

U.S. PATENT DOCUMENTS

| 4,121,334 A | 10/1978 | Wallis |
| 4,179,324 A | 12/1979 | Kirkpatrick |

(Continued)

FOREIGN PATENT DOCUMENTS

EP      0 410 679 A1    1/1991

(Continued)

OTHER PUBLICATIONS

Wiegand, M. et al., "Wafer Bonding of Silicon Wafers Covered with Various Surface Layers," *Sensors and Actuators*, 86 (2000), pp. 91-95, Elsevier Science B.V.

(Continued)

*Primary Examiner*—Mark A Osele
(74) *Attorney, Agent, or Firm*—Brinks Hofer Gilson & Lione

(57) ABSTRACT

The invention relates to the preparation of a thin layer comprising a step in which an interface is created between a layer used to create said thin layer and a substrate, characterized in that said interface is made in such a way that it is provided with at least one first zone (Z1) which has a first level of mechanical strength, and a second zone (Z2) which has a level of mechanical strength which is substantially lower than that of the first zone. Said interface can be created by glueing surfaces which are prepared in a differentiated manner, by a layer which is buried and embrittled in a differentiated manner in said zones, or by an intermediate porous layer.

18 Claims, 11 Drawing Sheets

U.S. PATENT DOCUMENTS

| | | | |
|---|---|---|---|
| 5,013,681 A | 5/1991 | Godbey et al. | |
| 5,034,343 A | 7/1991 | Rouse et al. | |
| 5,232,870 A | 8/1993 | Ito et al. | |
| 5,234,535 A | 8/1993 | Beyer et al. | |
| 5,256,581 A | 10/1993 | Foerstner et al. | |
| 5,310,446 A | 5/1994 | Konishi et al. | |
| 5,405,802 A | 4/1995 | Yamagata et al. | |
| 5,413,951 A | 5/1995 | Ohori et al. | |
| 5,559,043 A * | 9/1996 | Bruel | 438/407 |
| 5,567,654 A | 10/1996 | Beilstein, Jr. et al. | |
| 5,618,739 A | 4/1997 | Takahashi et al. | |
| 5,661,333 A | 8/1997 | Bruel et al. | |
| 5,811,348 A | 9/1998 | Matsushita et al. | |
| 5,817,368 A | 10/1998 | Hashimoto | |
| 5,854,123 A | 12/1998 | Sato et al. | |
| 5,877,070 A | 3/1999 | Goesele et al. | |
| 5,953,622 A | 9/1999 | Lee et al. | |
| 5,966,620 A | 10/1999 | Sakaguchi et al. | |
| 5,981,400 A | 11/1999 | Lo | |
| 5,985,412 A | 11/1999 | Gösele | |
| 5,994,207 A | 11/1999 | Henley et al. | |
| 6,010,591 A | 1/2000 | Gösele | |
| 6,013,563 A | 1/2000 | Henley et al. | |
| 6,020,252 A | 2/2000 | Aspar et al. | |
| 6,033,974 A | 3/2000 | Henley et al. | |
| 6,048,411 A | 4/2000 | Henley et al. | |
| 6,054,363 A | 4/2000 | Sakaguchi et al. | |
| 6,054,370 A * | 4/2000 | Doyle | 438/456 |
| 6,057,212 A | 5/2000 | Chan et al. | |
| 6,096,433 A | 8/2000 | Kikuchi et al. | |
| 6,103,597 A | 8/2000 | Aspar et al. | |
| 6,103,599 A | 8/2000 | Henley et al. | |
| 6,118,181 A | 9/2000 | Merchant et al. | |
| 6,159,323 A | 12/2000 | Joly et al. | |
| 6,190,998 B1 | 2/2001 | Bruel et al. | |
| 6,204,079 B1 | 3/2001 | Aspar et al. | |
| 6,225,190 B1 | 5/2001 | Bruel et al. | |
| 6,225,192 B1 | 5/2001 | Aspar et al. | |
| 6,271,101 B1 | 8/2001 | Fukunaga | |
| 6,294,478 B1 | 9/2001 | Shkaguchi et al. | |
| 6,303,468 B1 | 10/2001 | Aspar et al. | |
| 6,316,333 B1 * | 11/2001 | Bruel et al. | 438/458 |
| 6,362,077 B1 | 3/2002 | Aspar et al. | |
| 6,362,082 B1 * | 3/2002 | Doyle et al. | 438/523 |
| 6,534,380 B1 | 3/2003 | Yamauchi et al. | |
| 6,645,831 B1 | 11/2003 | Shaheen et al. | |
| 6,645,833 B2 | 11/2003 | Brendel | |
| 6,727,549 B1 | 4/2004 | Doyle | |
| 6,756,285 B1 | 6/2004 | Moriceau et al. | |
| 6,756,286 B1 | 6/2004 | Moriceau et al. | |
| 6,774,010 B2 | 8/2004 | Chu et al. | |
| 6,946,365 B2 | 9/2005 | Aspar et al. | |
| 7,029,548 B2 | 4/2006 | Aspar et al. | |
| 2001/0007789 A1 | 7/2001 | Aspar et al. | |
| 2002/0185684 A1 | 12/2002 | Campbell et al. | |
| 2004/0009649 A1 | 1/2004 | Kub et al. | |
| 2004/0209441 A1 | 10/2004 | Maleville et al. | |
| 2005/0029224 A1 | 2/2005 | Aspar et al. | |
| 2007/0020895 A1 | 1/2007 | Moriceau et al. | |
| 2007/0202660 A1 | 8/2007 | Moriceau et al. | |
| 2007/0259528 A1 | 11/2007 | Moriceau et al. | |

FOREIGN PATENT DOCUMENTS

| | | |
|---|---|---|
| EP | 0 504 714 | 9/1992 |
| EP | 0 717 437 B1 | 6/1996 |
| EP | 0 767 486 B1 | 9/1997 |
| EP | 0 793 263 A2 | 9/1997 |
| EP | 0849 788 A2 | 6/1998 |
| EP | 0 889 509 A2 | 1/1999 |
| EP | 0 938 129 A1 | 8/1999 |
| EP | 0 989 593 A2 | 3/2000 |
| EP | 1 050 901 A2 | 11/2000 |
| EP | 1 059 663 A2 | 12/2000 |
| EP | 1 014 452 B1 | 5/2006 |
| FR | 2 771 852 A1 | 12/1997 |
| GB | 2 211 991 A | 7/1989 |
| JP | 53-104156 | 9/1978 |
| JP | 58 31519 | 2/1983 |
| JP | 62265717 | 11/1987 |
| JP | 101004013 | 1/1989 |
| JP | 08017777 | 1/1990 |
| JP | 4199504 | 7/1992 |
| JP | 07-254690 | 10/1995 |
| JP | 7-302889 | 11/1995 |
| JP | 8133878 | 5/1996 |
| JP | 09-213594 | 8/1997 |
| JP | 09-307719 | 11/1997 |
| JP | 10163166 | 6/1998 |
| JP | 10233352 | 9/1998 |
| JP | 11045862 | 2/1999 |
| JP | 11074208 | 3/1999 |
| JP | 11087668 | 3/1999 |
| JP | 11-145436 | 5/1999 |
| JP | 11317577 | 11/1999 |
| RU | 128757 | 6/2000 |
| WO | WO 95/20824 A1 | 8/1995 |
| WO | WO 99/08316 A1 | 2/1999 |
| WO | WO 99/35674 A1 | 7/1999 |
| WO | WO 99/39378 A1 | 8/1999 |
| WO | WO 00/48238 A1 | 8/2000 |
| WO | WO 00/63965 A1 | 10/2000 |
| WO | WO 01/11930 A2 | 2/2001 |
| WO | WO 01/43168 A2 | 6/2001 |
| WO | WO 02/47156 A1 | 6/2002 |
| WO | WO 02/083387 A1 | 10/2002 |

OTHER PUBLICATIONS

Theodore, N. David et al., TFSOI With Improved Oxidation Resistance (to Reduce Isolation Induced Stresses and Leakage), Motorola (bulletin) XP 000691920, *Technical Developments*, Nov. 1996, pp. 158-159.

U.S. Appl. No. 10/474,984, filed Jun. 10, 2004, Aspar et al.

Almedia et al. "Bond formation in ion beam synthesized amorphous gallium nitride", *Elsevier, This Solid Films*, 343-344 1999, pp. 632-636.

Aspar et al., Smart-Cute®: The basic fabrication process for UNIBOND® SOI wafers, *SEMI* 1996, pp. 37-46.

Haisma et al., Silicon-on-Insulator Wafer Bonding-Wafer Thinning Technological Evaluations, *JAPANese Journal of Applied Physics*, Aug. 28, 1989, No. 8, Part 1, Tokyo, Japan, pp. 1426-1443.

Maleville, C. et al, "Wafer Bonding and Hi-Implantation Mechanisms Involved In The Smart-Cut Technology", 1997, pp. 14-19.

Office Action (Non-Final) for U.S. Appl. No. 10/474,984—Dated Sep. 24, 2004.

Office Action (Non-Final) for U.S. Appl. No. 10/474,984—Dated Jun. 6, 2005.

Office Action (Non-Final) for U.S. Appl. No. 10/474,984—Dated Nov. 16, 2005.

Office Action (Non-Final) for U.S. Appl. No. 10/474,984—Dated May 17, 2006.

Office Action (Non-Final) for U.S. Appl. No. 10/474,984—Dated May 7, 2007.

Office Action (Non-Final) for U.S. Appl. No. 10/474,984—Dated Feb. 6, 2008.

Office Action (Final) for U.S. Appl. No. 10/474,984—Dated Oct. 17, 2008.

Office Action (Non-Final) for U.S. Appl. No. 10/474,984—Dated Jul. 7, 2009.

Office Action (Non-Final) for U.S. Appl. No. 10/565,621—Dated May 15, 2007.

Office Action (Final) for U.S. Appl. No. 10/565,621—Dated Feb. 11, 2008.

Office Action (Non-Final) for U.S. Appl. No. 10/565,621—Dated Sep. 12, 2008.
Office Action (Final) for U.S. Appl. No. 10/565,621—Dated Mar. 12, 2009.
Wiegand, M. et al., "Wafer Bonding of Silicon Wafers Covered With Various Surface Layers", *Sensors and Actuators*, Elsevier Science B.V., vol. 86, 2000, pp. 91-95.
U.S. District Court District of Delaware (Wilmington) Civil Docket For Case #: 1:08-cv-00292-SLR—(19 pgs).
Complaint filed with Jury Demand against MEMC Electronic Materials Inc.—Magistrate Consent Notice to Pltf. ( Filing fee $ 350, receipt No. 152004.)—filed by SOITEC Silicon On Insulator Technologies SA, Commissariat a LEnergie Atomique. (Attachments: # 1 Exhibit 1, # 2 Exhibit 2, # 3 Exhibit 3, # 4 Civil Cover Sheet, # 5 Acknowledgement of Consent Form) (sns, ) (Entered: May 20, 2008) (47 pgs).
Report to the Commissioner of Patents and Trademarks for Patent/Trademark Nos. RE39,484 E; 6,809,009; 7,067,396 B2; (sns,) (Entered: May 20, 2008) (1 pg).
Summons Returned Executed by SOITEC Silicon on Insulator Technologies SA, Commissariat a LEnergie Atomique. MEMC Electronic Materials Inc. served on May 19, 2008, answer due Jun. 9, 2008. (Kraft, Denise) (Entered: May 20, 2008) (2 pgs).
Motion for Pro Hac Vice Appearance of Attorney George W. Neuner, Alan M. Spiro, Brian M. Gaff and Carolyn D'Agincourt—filed by SOITEC Silicon On Insulator Technologies SA, Commissariat a LEnergie Atomique. (Attachments: # 1 Certificate of Compliance Certification by Counsel To Be Admitted Pro Hac Vice, # 2 Certificate of Compliance Certification by Counsel To Be Admitted Pro Hac Vice, # 3 Certificate of Compliance Certification by Counsel To Be Admitted Pro Hac Vice, # 4 Certificate of Compliance Certification by Counsel To Be Admitted Pro Hac Vice, # 5 Certificate of Service)(Kraft, Denise) (Entered: May 23, 2008) (6 pgs).
Stipulation to Extend Time Answer to Complaint to Jul. 9, 2008—filed by MEMC Electronic Materials Inc.. (Rogowski, Patricia) (Entered: Jun. 5, 2008) (1 pg).
Motion for Pro Hac Vice Appearance of Attorney Robert M. Evans, Jr., David W. Harlan, Richard L. Brophy, Marc W. Vander Tuig—filed by MEMC Electronic Materials Inc.. (Attachments: # 1 Certification of Robert M. Evans, Jr., # 2 Certification of David W. Harlan, # 3 Certification of Richard L. Brophy, # 4 Certification of Marc W. Vander Tuig)(Rogowski, Patricia) (Entered: Jun. 9, 2008) (6 pgs).
Motion for Pro Hac Vice Appearance of Attorney Michael L. Brody, Richard P. Gilly, Gail J. Standish, Marcus T. Hall and Jason S. Charkow—filed by SOITEC Silicon On Insulator Technologies SA. (Attachments: # 1 Certification By Counsel to be Admitted Pro Hac Vice, # 2 Certification By Counsel to be Admitted Pro Hac Vice, # 3 Certification By Counsel to be Admitted Pro Hac Vice, # 4 Certification By Counsel to be Admitted Pro Hac Vice, # 5 Certification By Counsel to be Admitted Pro Hac Vice)(Kraft, Denise) (Entered: Jun. 10, 2008) (8 pgs).
Disclosure Statement pursuant to Rule 7.1 filed by SOITEC Silicon On Insulator Technologies SA, Commissariat a LEnergie Atomique. (Attachments: # 1 Certificate of Service)(Kraft, Denise) (Entered: Jun. 16, 2008) (3 pgs).
Motion to Dismiss Based upon or, in the Alternative, Motion for a More Definite Statement—filed by MEMC Electronic Materials Inc. (Rogowski, Patricia) (Entered: Jul. 9, 2008) (4 pgs).
Opening Brief in Support re 10 Motion to Dismiss Based upon or, in the Alternative, Motion for a More Definite Statement filed by MEMC Electronic Materials Inc. .Answering Brief/Response due date per Local Rules is Jul. 28, 2008. (Rogowski, Patricia) (Entered: Jul. 9, 2008) (15 pgs).
Disclosure Statement pursuant to Rule 7.1 filed by MEMC Electronic Materials Inc. (Rogowski, Patricia) (Entered: Jul. 9, 2008) (3 pgs).
Answering Brief in Opposition re 10 Motion to Dismiss Based upon or, in the Alternative, Motion for a More Definite Statement filed by Commissariat a L'Energie Atomique. Reply Brief due date per Local Rules is Aug. 7, 2008. (Attachments: # 6 Exhibit A, # 7 Exhibit B, # Certificate of Service) (Kraft, Denise) (Modified on Jul. 29, 2008 (lid). (Entered: Jul. 28, 2008) (29 pgs).
Sealed Reply Brief re 10 Motion to Dismiss Based upon or, in the Alternative, Motion for a More Definite Statement filed by MEMC Electronic Materials Inc. (Rogowski, Patricia) (Entered: Aug. 7, 2008) Redacted Reply Brief re 14—re 10 Motion to Dismiss Based upon or, in the Alternative, Motion for a More Definite Statement filed by MEMC Electronic Materials Inc. (Attachments: # 1 Exhibit 2, # 2 Exhibit 3, # 3 Exhibit 4, # 4 Exhibit 5, # 5 Unreported Cases, # 6 Certificate of Service) (Rogowski, Patricia) Modified on Aug. 8, 2008 (lid). (Entered: Aug. 7, 2008) (98 pgs).
Notice of Service of Plaintiffs' Initial Disclosures Pursuant to Fed. R. Civ. P. 26(a)(1) by SOITEC Silicon On Insulator Technologies SA, Commissariat a L'Energie Atomique. (Attachments: # 1 Certificate of Service) (Kraft, Denise) (Entered: Feb. 27, 2009) (4 pgs).
Answer to 1 Complaint, with Jury Trial Demanded, Counterclaim against all plaintiffs by MEMC Electronic Materials Inc.. (Attachments: # 1 Exhibit A)(Rogowski, Patricia) (Entered: Mar. 6, 2009) (55 pgs).
Notice of Service of MEMC Electronic Materials, Inc.'s Initial Disclosures by MEMC Electronic Materials Inc. (Rogowski, Patricia) (Entered: Mar. 6, 2009) (3 pgs).
Proposed Order Proposed Scheduling Order re 16 Memorandum and Order, Set Hearings, by SOITEC Silicon On Insulator Technologies SA, Commissariat a 'LEnergie Atomique. (Kraft, Denise) (Entered: Mar. 10, 2009) (7 pgs).
Letter to The Honorable Sue L. Robinson from Denise Seastone Kraft, Esq. regarding [Proposed] Scheduling Order—re 21 Proposed Order, 16 Memorandum and Order, Set Hearings,. (Kraft, Denise) (Entered: Mar. 10, 2009) (1 pg).
Stipulation to Extend Time to Respond or Otherwise Plead to Defendant's Counterclaim to Apr. 7, 2009—filed by SOITEC Silicon On Insulator Technologies SA, Commissariat a L'Energie Atomique. (Attachments: # 1 Certificate of Service)(Kraft, Denise) (Entered: Mar. 11, 2009) (2 pgs).
Proposed Order Revised Scheduling Order re 21 Proposed Order, 16 Memorandum and Order,, Set Hearings, by SOITEC Silicon On Insulator Technologies SA, Commissariat a L'Energie Atomique. (Kraft, Denise) (Entered: Mar. 12, 2009) (7 pgs).
Letter to the Honorable Sue L. Robinson from Denise Seastone Kraft regarding Revised Scheduling Order Pursuant to Mar 12, 2009 Telephonic Scheduling Conference—re 24 Proposed Order. (Kraft, Denise) (Entered: Mar. 12, 2009) (1 pg).
Scheduling Order: Case referred to the Magistrate Judge for the purpose of exploring ADR. Joiner of Parties due by Aug. 14, 2009. Amended Pleadings due by Aug. 14, 2009. Discovery due by Apr. 23, 2010. Discovery Conference set for Jun. 25, 2009 04:30 PM in Courtroom 6B before Judge Sue L. Robinson. Dispositive Motions due by Jun. 25, 2010. Answering Brief due Jul. 16, 2010. Reply Brief due Jul. 30, 2010. Oral Argument set for Aug. 27, 2010 09:30 AM in Courtroom 6B before Judge Sue L. Robinson. Claim Construction Opening Briefs due by Jun. 18, 2010. Response Briefs due Jul. 9, 2010. Final Pretrial Conference set for Oct. 14, 2010 04:30 PM in Courtroom 6B before Judge Sue L. Robinson. Jury Trial set for Oct. 25, 2010 09:30 AM in Courtroom 6B before Judge Sue L. Robinson. Signed by Judge Sue L. Robinson on Mar. 16, 2009. (nmf) (Entered: Mar. 16, 2009) (7 pgs).
Order Setting Teleconference: Telephone Conference set for Mar. 23, 2009 at 11:00 AM before Judge Mary Pat Thynge to discuss ADR. Signed by Judge Mary Pat Thynge on Mar. 16, 2009. (cak) (Entered: Mar. 16, 2009) (4 pgs).
Order Setting Teleconference: a teleconference has been scheduled for Monday, Jun. 1, 2009 at 10:00 a.m. with Magistrate Judge Thynge to discuss the status of the case and the parties negotiations. Counsel for MEMC shall initiate the teleconference call to 302-573-6173. It is Further Ordered that the Court is holding Sep. 10, Sep. 14 and Sep. 15, 2009 as possible mediation dates. Counsel are to advise Judge Thynge by Mar. 30, 2009 if any of these dates works for everyone to schedule the mediation. Signed by Judge Mary Pat Thynge on Mar. 23, 2009. (cak) (Entered: Mar. 23, 2009) (2 pgs).
Order Setting Mediation Conferences: Mediation Conference Tentatively set for Sep. 15, 2009 at 10:00 AM in Courtroom 2B before Judge Mary Pat Thynge. See order for details. Signed by Judge Mary Pat Thynge on Mar. 24, 2009. (cak) (Entered: Mar. 24, 2009) (6 pgs).
Motion to Dismiss Based upon Fed. R. Civ. P. 12(b)(1) and (6) and Article III of the United States Constitution—filed by SOITEC Silicon On Insulator Technologies SA, Commissariat a LEnergie Atomique. (Attachments: # 1 Text of Proposed Order, # 2 Certificate of Service)(Kraft, Denise) (Entered: Apr. 7, 2009) (5 pgs).
Opening Brief in Support re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution filed by SOITEC Silicon On Insulator Technologies SA, Commissariat a L'Energie Atomique Answering Brief/Response due date per Local Rules is Apr. 27, 2009. (Attachments: # 1 Certificate of Service)(Kraft, Denise) (Entered: Apr. 7, 2009) (13 pgs).
Answer to 19 Answer to Complaint, Counterclaim Partial Answer to Defendant's Counterclaims, Affirmative Defenses and Soitec Counterclaims, Counterclaim against MEMC Electronic Materials Inc. by SOITEC Silicon On Insulator Technologies SA, Commissariat a LEnergie Atomique. (Attachments: # 1 Certificate of Service)(Kraft, Denise) (Entered: Apr. 7, 2009) (18 pgs).
Notice of Service of First Request for Production of Documents and Things Directed to Commissariat A L'Energie Atomique; First Request for Production of Documents and Things Directed to SOITEC Silicon on Insulator Technologies, S.A. and Soitec USA, Inc.; and First Set of Interrogatories Directed to SOITEC Silicon on Insulator Technologies, S.A., Soitec USA, Inc. and Commissariat A L'Energie Atomique by MEMC Electronic Materials Inc. (Rogowski, Patricia) (Entered: Apr. 14, 2009) (3 pgs).
Stipulation to Extend Time for Defendant to File an Answering Brief in Opposition to Plaintiffs' Partial Motion to Dismiss Counterclaim Counts II, III, IV, V, and VIII; and Stipulation to Extend Time for Plaintiffs to File Responses to MEMC's First Requests For Production of Documents and to MEMC's First Set of Interrogatories to May 29, 2009—filed by SOITEC Silicon On Insulator Technologies SA, Commissariat a L'Energie Atomique. (Attachments: # 1 Certificate of Service)(Kraft, Denise) (Entered: May 13, 2009).
Answer to 32 Answer to Counterclaim,,, of S.O.I. TEC Silicon on Insulator Technologies, S.A. and SOITEC U.S.A., Inc. By MEMC Electronic Materials Inc. (Rogowski, Patricia) (Entered: Apr. 23, 2009) (4 pgs).
Stipulation to Extend Time Answering Brief in Opposition to Plaintiffs' Partial Motion to Dismiss Counterclaim Counts II, Ill, IV, V and VIII to May 15, 2009—filed by MEMC Electronic Materials Inc.. (Rogowski, Patricia) (Entered: May 6, 2009) (3 pgs).
Notice of Service of Soitec's First Set of Interrogatories (Nos. 1-17) and Soitec's First Set of Requests for Production of Documents and Things (Nos. 1-132) by SOITEC Silicon On Insulator Technologies SA, Commissariat a 'LEnergie Atomique. (Attachments: # 1 Certificate of Service)(Kraft, Denise) (Entered: May 6, 2009) (2 pgs).
Stipulation to Extend Time for Defendant to File an Answering Brief in Opposition to Plaintiffs' Partial Motion to Dismiss Counterclaim Counts II, Ill, IV, V, and VIII; and Stipulation to Extend Time for Plaintiffs to File Responses to MEMC's First Requests For Production of Documents and to MEMC's First Set of Interrogatories to May 29, 2009—filed by SOITEC Silicon On Insulator Technologies SA, Commissariat a L'Energie Atomique. (Attachments: # 1 Certificate of Service)(Kraft, Denise) (Entered: May 13, 2009).
Notice of Service of (1) Subpoena to Hayes Soloway, P.C., (2) Subpoena to Pearne & Gordon, LLP, (3) Subpoena to Brinks Hofer Gilson & Lione, and (4) Subpoena to Winston & Strawn by MEMC Electronic Materials Inc. (Rogowski, Patricia) (Entered: May 14, 2009) So Ordered- re 38 Stipulation to Extend Time. Set Briefing Schedule: re 30 Motion to Dismiss. (Answering Brief due May 29, 2009.) (Refer to Stipulation for Further Details.). Signed by Judge Sue L. Robinson on May 15, 2009. (lid) (Entered: May 15, 2009).
Stipulation To Extend Time for Defendant to File Its Answering Brief until Jun. 5, 2009 by MEMC Electronic Materials Inc.. (Rogowski, Patricia) (Entered: May 28, 2009) So Ordered, re 40 Stipulation, Set Briefing Schedule: re 30 Motion to Dismiss Based upon Fed. R. Civ. P. 12(b)(1) and (6) and Article III of the United States Constitution. (Answering Brief due Jun. 5, 2009.). Signed by Judge Sue L. Robinson on May 29, 2009. (nmf) (Entered: May 29, 2009).
Notice of Service of (1) Soitec's Objections and Responses to MEMC's First Set of Interrogatories; (2) Soitecs Objections and Responses to MEMC's First Request for Production of Documents and Things; (3) CEAs Objections and Responses to MEMC's First Set of Interrogatories; and (4) CEAs Objections and Responses to MEMC's First Request For Production of Documents and Things by SOITEC Silicon On Insulator Technologies SA, Commissariat a L'Energie Atomique. (Attachments: # 1 Certificate of Service) (Kraft, Denise) (Entered: May 29, 2009).
Stipulation To extend date to Jun. 19, 2009 by which defendant may file an answering brief in opposition to plaintiffs' Partial Motion to Dismiss Counterclaim Counts II, III, IV, V, and VIII by MEMC Electronic Materials Inc.. (Rogowski, Patricia) (Entered: Jun. 5, 2009).
Notice of Service of MEMC's Answers to SOITEC's First Set of Interrogatories (Nos. 1-17) and MEMC's Responses to SOITEC's First Set of Requests for Production of Documents and Things (Nos. 1-132) by MEMC Electronic Materials Inc..(Rogowski, Patricia) (Entered: Jun. 5, 2009) So Ordered- re 42 Stipulation to Extend Time. Set Briefing Schedule: re 30 Motion to Dismiss. (Answering Brief due Jun. 19, 2009.). Signed by Judge Sue L. Robinson on Jun. 8, 2009. (lid) (Entered: Jun. 8, 2009).
Notice of Service of Soitec's Second Set of Requests For Production of Documents and Things (Nos. 133-135) re 41 Notice of Service,, by SOITEC Silicon On Insulator Technologies SA, Commissariat a LEnergie Atomique. Related document: 41 Notice of Service,, filed by SOITEC Silicon On Insulator Technologies SA, Commissariat a L'Energie Atomique. (Attachments: # 1 Certificate of Service)(Kraft, Denise) (Entered: Jun. 11, 2009).
Letter to Honorable Sue L. Robinson from Patricia Smink Rogowski regarding Transmitting Form of Protective Order. (Attachments: # 1 Form of Protective Order, # 2 Exhibit Exhibit A to Form of Protective Order)(Rogowski, Patricia) (Entered: Jun. 16, 2009).
Stipulation to Extend Time Defendant's Answering Brief in Opposition to Plaintiffs' Partial Motion to Dismiss Counterclaim Counts II, III, IV, V, and VIII to Jul. 2, 2009—filed by MEMC Electronic Materials Inc.. (Rogowski, Patricia) (Entered: Jun. 19, 2009) So Ordered- re 47 Stipulation to Extend Time. Set Briefing Schedule: re 30 Motion to Dismiss (Answering Brief due Jul. 2, 2009.). Signed by Judge Sue L. Robinson on Jun. 23, 2009. (lid) (Entered: Jun. 23, 2009) So Ordered, re 45 Protective Order. Signed by Judge Sue L. Robinson on Jun. 30, 2009. (nmf) (Entered: Jun. 30, 2009).
Notice of by SOITEC Silicon On Insulator Technologies SA, Commissariat a L'Energie Atomique re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution *Notice of Withdrawal of Plaintiffs' Partial Motion to Dismiss Counterclaim Counts II, III, IV, V, and VIII* (Attachments: # 1 Certificate of Service)(Kraft, Denise) (Entered: Jul. 2, 2009).
Notice of Service of MEMC's Responses to SOITEC's Second Set of Requests for Production of Documents and Things Directed to MEMC by MEMC Electronic Materials Inc..(Rogowski, Patricia) (Entered: Jul. 14, 2009).
Stipulation and [Proposed] Order to File an Amended Complaint by SOITEC Silicon On Insulator Technologies SA, Commissariat a LEnergie Atomique. (Attachments: # 1 Exhibit A, # 2 Certificate of Service)(Kraft, Denise) (Entered: Jul. 16, 2009).
Notice of Service of Soitec's Objections and Responses to MEMC's Second Request For Production of Documents and Things Directed To Soitec re 46 Notice of Service by SOITEC Silicon On Insulator Technologies SA, Commissariat a LEnergie Atomique. Related document: 46 Notice of Service filed by MEMC Electronic Materials Inc. (Attachments: # 1 Certificate of Service)(Kraft, Denise) (Entered: Jul. 16, 2009).
Notice of Withdrawal of Docket Entry 51 by SOITEC Silicon On Insulator Technologies SA, Commissariat a L'Energie Atomique re 51 Notice of Service, (Attachments: # 1 Certificate of Service)(Kraft, Denise) (Entered: Jul. 17, 2009).
Notice of Service of SOITEC's Objections and Responses to MEMC's Second Request for Production of Documents and Things Directed to SOITEC re 46 Notice of Service by SOITEC Silicon On Insulator Technologies SA, Commissariat a L'Energie Atomique. Related document: 46 Notice of Service filed by MEMC Electronic Materials Inc.. (Attachments: # 1 Certificate of Service)(Kraft, Denise) (Entered: Jul. 17, 2009).
Notice of Service of MEMC Electronic Materials, Inc.'s Second Set of Interrogatories Directed to S.O.I.TEC Silicon on Insulator Technologies, S.A., SOITEC USA, Inc. and Commissariat A L'Energie Atomique by MEMC Electronic Materials Inc..(Rogowski, Patricia) (Entered: Jul. 17, 2009).

Notice of Service of Soitec's Production of Documents Bates Numbered SCEA 00000001 to SCEA 00002442 by SOITEC Silicon On Insulator Technologies SA, Commissariat a L'Energie Atomique. (Attachments: # 1 Certificate of Service)(Kraft, Denise) (Entered: Jul. 17, 2009) So Ordered, re 50 Stipulation. Signed by Judge Sue L. Robinson on Jul. 20, 2009. (nmf) (Entered: Jul. 20, 2009).

Notice of Service of MEMC's Production of Documents Bates Numbered MEMC0300000 to MEMC0306530 by MEMC Electronic Materials Inc. (Rogowski, Patricia) (Entered: Jul. 20, 2009).

First Amended Complaint for *Patent Infringement* against MEMC Electronic Materials Inc.—filed by SOITEC Silicon On Insulator Technologies SA, Commissariat a L'Energie Atomique. (Attachments: # 1 Exhibit Exhibit 1, # 2 Exhibit Exhibit 2, # 3 Exhibit Exhibit 3, # 4 Exhibit Exhibit 4, # 5 Certificate of Service)(Kraft, Denise) (Entered: Jul. 21, 2009).

Notice of Service of Soitec S.A.'s Second Set of Interrogatories (Nos. 18-22) and CEA's First Set of Interrogatories (Nos. 1-11) by Soitec Silicon On Insulator Technologies SA, Commissariat a L'Energie Atomique. (Attachments: # 1 Certificate of Service)(Kraft, Denise) (Entered: Jul. 23, 2009).

Notice of Service of S.O.I.TEC Silicon on Insulator Technologies, S.A. and Commissariat a Lenergie Atomique Supplemental Production of Documents Bates Numbered Slit 00000001 to Slit 00049728 re 43 Notice of Service, by SOITEC Silicon On Insulator Technologies SA, Commissariat a LEnergie Atomique. Related document: 43 Notice of Service, filed by MEMC Electronic Materials Inc.. (Attachments: # 1 Certificate of Service)(Kraft, Denise) (Entered: Jul. 27, 2009).

Answer to Amended Complaint Answer to 57 Amended Complaint, with Under Federal Rule of Civil Procedure 38, MEMC demands a trial by jury on all issues so triable., Counterclaim against all plaintiffs by MEMC Electronic Materials Inc.. (Attachments: # 1 Exhibit A, # 2 Certificate of Service)(Rogowski, Patricia) (Entered: Aug. 3, 2009).

Notice of Service of MEMC's Production of Documents Bates Numbered MEMC0300000—MEMC0337055 by MEMC Electronic Materials Inc. (Rogowski, Patricia) (Entered: Aug. 5, 2009).

Notice of Service of S.O.I.TEC Silicon on Insulator Technologies, S.A. and Commissariat a L Energie Atomique's Revised Supplemental Production of Documents Bates Numbered SLIT00000001—SLIT0004886; SLIT00004931 SLIT00004985; SLIT00005169 SLIT00005174; SLIT00005241 SLIT00006368; and SLIT00006886—SLIT00049728 re 59 Notice of Service, by SOITEC U.S.A., Inc., SOITEC Silicon On Insulator Technologies SA, Commissariat a LEnergie Atomique. Related document: 59 Notice of Service, filed by SOITEC Silicon On Insulator Technologies SA, Commissariat a LEnergie Atomique. (Attachments: # 1 Certificate of Service)(Kraft, Denise) (Entered: Aug. 6, 2009).

Stipulation to Extend Time to Answer or Otherwise Respond to MEMC's Amended Counterclaims to Aug. 31, 2009—filed by SOITEC Silicon On Insulator Technologies SA, SOITEC U.S.A., Inc., Commissariat a L'Energie Atomique. (Attachments: # 1 Certificate of Service)(Kraft, Denise) (Entered: Aug. 25, 2009).

Notice of Service of S.O.I.TEC Silicon on Insulator Technologies, S.A. and Commissariat a L'Energie Atomique's Supplemental Production of Documents Bates Numbered SOIT 00000001 to SOIT 00003528 and SLIT 00049729 to SLIT 00060612 by SOITEC Silicon On Insulator Technologies SA, SOITEC U.S.A., Inc., Commissariat a L'Energie Atomique. (Attachments: # 1 Certificate of Service)(Kraft, Denise) (Entered: Aug. 25, 2009).

Notice of Service of MEMC's Production of Documents Bates Numbered MEMC0337056 to MEMC0337503 and MEMC0337504-MEMC0338047 by MEMC Electronic Materials Inc..(Rogowski, Patricia) (Entered: Aug. 26, 2009).

Notice of Service of (1) SOITECs Supplemental Responses to MEMC Electronic Materials, Inc's First Set of Interrogatories; and (2) CEAs Supplemental Responses to MEMC Electronic Materials, Inc.s First Set of Interrogatories re 41 Notice of Service,, by SOITEC Silicon On Insulator Technologies SA, SOITEC U.S.A., Inc., Commissariat a L'Energie Atomique. Related document: 41 Notice of Service,, filed by SOITEC Silicon On Insulator Technologies SA, Commissariat a L'Energie Atomique. (Attachments: # 1 Certificate of Service)(Kraft, Denise) (Entered: Aug. 26, 2009).

Answer to 60 Answer to Amended Complaint, Counterclaim,,, Counterclaim *Reply to Defendant's Amended Counterclaims, Counterclaims And Affirmative Defenses* against MEMC Electronic Materials Inc. By SOITEC Silicon On Insulator Technologies SA, Commissariat a L'Energie Atomique, SOITEC U.S.A., Inc.. (Attachments: # 1 Certificate of Service)(Kraft, Denise) (Entered: Aug. 31, 2009).

Notice of Service of MEMC's Third Set of Interrogatories Directed to S.O.I.TEC Silicon on Insulator Technologies, S.A., SOITEC USA, Inc., and Commissariat a L'Energie Atomique by MEMC Electronic Materials Inc. (Rogowski, Patricia) (Entered: Sep. 1, 2009).

\* cited by examiner

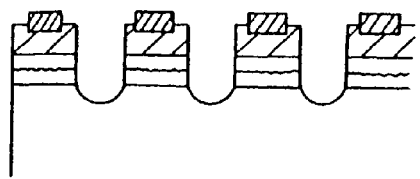
Fig.33
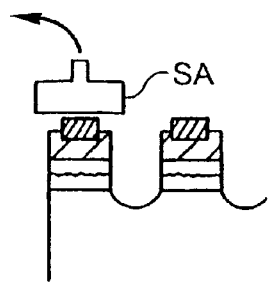
Fig.34
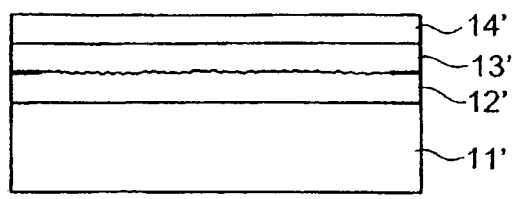
Fig.35
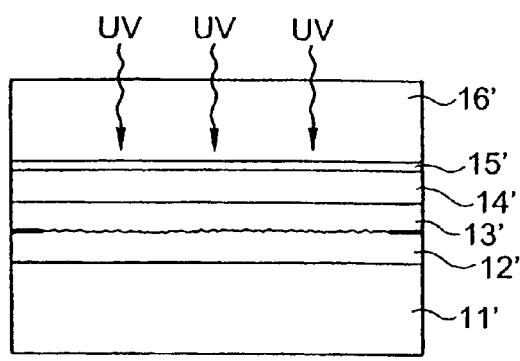
Fig.36
Fig.37
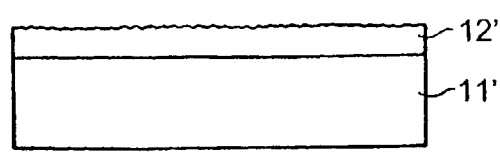
Fig.38
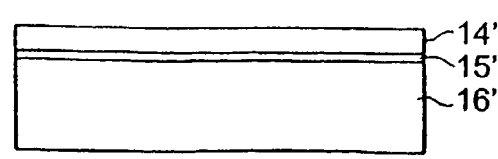

DETACHABLE SUBSTRATE OR DETACHABLE STRUCTURE AND METHOD FOR THE PRODUCTION THEREOF

This application claims priority to French Patent Application No. 0105129 filed Apr. 13, 2001.

TECHNICAL FIELD

The invention relates to the production of components from a thin layer on a substrate and the production of this thin layer/substrate assembly. The substrate can be an initial or intermediate substrate and can be detachable, such as adapted to be separated from the thin layer.

BACKGROUND

Increasingly, components must be integrated onto supports different from those used to produce them. Components on plastics material substrates or on flexible substrates may be cited, for example. By component is meant any microelectronic, opto-electronic or sensor (for example chemical, mechanical, thermal, biological or biochemical sensor) device that is completely or partly "processed", such as completely or partly produced.

A layer transfer method can be used to integrate the components onto flexible supports.

There are many other examples of applications in which layer transfer techniques can provide a suitable solution for integrating components or layers onto a support that is a priori unsuited to their production. In the same line of thinking, layer transfer techniques are also very useful when it is required to isolate a thin layer, with or without components, from its original substrate, for example by separating or eliminating the latter. Still in the same line of thinking, turning over a thin layer and transferring it onto another support provides engineers with valuable freedom to design structures that would otherwise be impossible. Sampling and turning over thin films can be used to produce buried structures, for example, such as buried capacitors for dynamic random access memory (DRAM) where, in contradistinction to the usual situation, the capacitors are formed first and then transferred onto another silicon substrate before fabricating the remainder of the circuits on the new substrate. Another example relates to the production of transistor structures referred to as double gate structures. The first gate of the CMOS transistor is produced on a substrate using a conventional technology and then turned over and transferred to a second substrate to produce the second gate and finish the transistor, thereby leaving the first gate buried in the structure (see, for example, K. Suzuki, T. Tanaka, Y. Tosaka, H. Horie and T. Sugii, "High-Speed and Low-Power n+-p+ Double-Gate SOI CMOS", IEICE Trans. Electron., vol. E78-C, 1995, pp. 360-367).

The requirement to isolate a thin layer from its original substrate is encountered in the field of light-emitting diodes (LED), for example, for instance as reported in the documents W. S Wong et al., Journal of Electronic MATERIALS, page 1409, Vol. 28, No 12, 1999 and I. Pollentier et al., page 1056, SPIE Vol. 1361 Physical Concepts of Materials for Novel Opto-electronic Device Applications I (1990). One of the objects here is to improve the control of extraction of the emitted light. Another object relates to the fact that in this particular example the sapphire substrate used to produce the epitaxial stack is a posteriori bulky, in particular because it is electrically insulative, which prevents making electrical contacts to its rear face. To be able to remove afterwards the sapphire substrate, which was advantageous for the phase of growing the material, would thus appear to be desirable.

An identical situation is encountered in the field of applications to telecommunications and microwaves, for example. In this situation, it is preferable for the components to be finally integrated onto a support having a high resistivity, typically at least several kohms·cm. However, a highly resistive substrate is not necessarily available at the same cost and with the same quality as the standard substrates usually employed. In the case of silicon, 200 and 300 mm silicon wafers of standard resistivity are available, whereas for resistivities greater than 1 kohm·cm, there is very little on offer in the 200 mm size and nothing at all in the 300 mm size. One solution consists in producing the components on standard substrates and then, during the final process steps, transferring a thin layer containing the components onto a glass, quartz, sapphire, etc. insulative substrate.

From a technical point of view, the major benefit of these transfer operations is to decorrelate the properties of the layer in which the components are formed and those of the final support layer, and they are consequently beneficial in many other situations.

There may also be cited situations in which the substrate that is beneficial for the production of the components is excessively costly. In this case, for example that of silicon carbide, offering improved performance (higher temperatures of use, significantly improved maximum powers and frequencies of use, and the like), but whose cost compared to silicon is very high, it would be beneficial to transfer a thin layer of the costly substrate (in this instance silicon carbide) onto the inexpensive substrate (here silicon), and to recover the remainder of the costly substrate for re-use, possibly after a recycling operation. The transfer operation can be carried out before, during or after the production of the components.

The above techniques can also prove beneficial in all fields in which obtaining a thin substrate is important for the final application. Power applications in particular may be cited, whether for reasons associated with the evacuation of heat, which is improved if the substrate is thin, or because in some cases the current must flow through the thickness of the substrates with losses that are to a first approximation proportional to the thickness through which the current passes. Smart card applications for which a thin substrate is required for reasons of flexibility may also be cited. For these applications, the circuits are produced on thick or standard thickness substrates, which has the advantage, firstly, of good mechanical resistance to the various process steps, and, secondly, of conforming to standards with regard to their use on certain production equipment. The final thinning is achieved by separation. This separation can be accompanied by transfer to another support. In some cases the transfer to another support is not indispensable, especially if the final thickness aimed at during thinning is sufficient to produce self-supporting structures.

Various techniques can be used to transfer layers from one support to another. The techniques disclosed in 1985 by T. Hamaguchi et al., Proc. IEDM, 1985, p. 688, may be cited, for example. These techniques are of great benefit since they enable a layer to be transferred from one substrate to another, but they necessarily consume the basic substrate (which is destroyed during the process) and cannot achieve homogeneous transfer of a thin film unless a stop layer is present (i.e. a non-homogeneous layer in the substrate material).

Of the transfer methods known to the person skilled in the art, it is also possible to use one of transferring thin layers of materials that may contain all or part of a microelectronic component. Some of these methods are based on creating a buried weak layer within a material, by introducing one or more gaseous substances. On this subject see the documents U.S. Pat. No. 5,374,564 (or EP-A-533551), U.S. Pat. No. 6,020,252 (or EP-A-807970), FR-A-2767416 (or EP-A-1010198), FR-A-2748850 (or EP-A-902843), and FR-A-2773261 (or EP-A-963598), which disclose such methods.

These methods are generally used with the objective of detaching the whole of a film from an original substrate to transfer it onto a support. The thin film obtained may then contain a portion of the original substrate. These films can serve as active layers for the production of electronic or optical components. They may contain some or all of a component.

These methods in particular enable reuse of the substrate after separation, very little of the substrate being consumed on each cycle. This is because the thickness removed is frequently no more than a few micrometers, whereas substrate thicknesses are typically several hundred micrometers. It is therefore possible to obtain substrates that are similar to substrates that are "demountable" (that is to say detachable) by mechanical stress, in particular in the case of the method disclosed in the document U.S. Pat. No. 6,020,252 (or EP-A-807970). This particular process is based on implantation to form a fragile buried region which is cut at the time of final transfer.

Other methods, based on the "lift-off" principle, also separate a thin layer from the remainder of its original support, again without the latter necessarily being consumed. These methods generally use selective chemical etching of a buried intermediate layer, possibly associated with mechanical forces. This type of method is very widely used to transfer III-V elements to different types of support (see C. Camperi et al., IEEE Transactions on photonics technology, vol. 3, 12 (1991), 1123). As explained in the paper by P. Demeester et al., Semicond. Sci. Technol. 8 (1993), 1124-1135, the transfer, which generally takes place after an epitaxial growth step, can be carried out before or after the production of the components (by "post-processing" or "pre-processing", respectively).

Of the methods using a (pre-existing) buried layer of lower mechanical strength than the remainder of the substrate to obtain localized separation, the ELTRAN® method may be cited (Japanese Patent Publication Number 07302889). In this case, a stack based on monocrystalline silicon is locally weakened by the formation of a porous region. Another similar situation consists in exploiting the presence of a buried oxide in the case of a silicon on insulator (SOI) structure, however standard the latter may otherwise be (i.e. produced without seeking any particular detachability effect). If the structure is bonded sufficiently strongly to another substrate and a high stress is applied to the structure, localized fracture, preferentially achieved in the oxide, can lead to a cutting effect on the scale of the entire substrate. The document "PHILIPS Journal of Research", vol. 49, No 1/2, 1995, shows an example of this on pages 53 to 55. Unfortunately, the fracture is difficult to control and necessitates high mechanical stresses to bring it about, which is not free of the risk of breaking of the substrate or damaging the components.

The advantage of such buried fragile layer methods is that they can be used to produce layers based on crystalline silicon (or SiC, InP, AsGa, LiNbO3, $LiTaO_3$, and the like) in a range of thickness from a few tens of angstrom units (A) to a few micrometers (μm), with very good homogeneity. Greater thicknesses can also be achieved.

To fabricate detachable structures for possible subsequent transfer of a layer onto another support or substrate, it is known to the person skilled in the art to control the energies of the bonds between the layer and the substrate, as indicated in the document EP 0702609 A1.

The inventors of this patent are also aware that, to produce a detachable substrate, it is also possible to use methods involving the control of bonding forces existing at the "detachment" surface to assemble together temporarily the thin layer and the substrate from which it is subsequently to be detached. The situation in which the bonding is obtained by molecular adhesion is of particular benefit. Of the categories of assemblies obtained by molecular bonding, silicon on insulator (SOI) substrates produced by these bonding techniques constitute a particularly beneficial category. The category encompasses a number of variants, the principles of which are described in the book "Semiconductor Wafer bonding Science and Technology", Q.-Y. Tong and U. Gosele, a Wiley Interscience publication, John Wiley & Sons, Inc. Some variants are known as bonded SOI (BSOI) or bond and etch back SOI (BESOI). Apart from bonding involving molecular adhesion, these variants rely on physical removal of the original substrate, by polishing techniques and/or chemical etching techniques. Other variants, described in part heretofore as layer transfer techniques, are additionally based on bonding by molecular adhesion and separation by "cutting" along a region that has been weakened, for example as in the methods described in the documents U.S. Pat. No. 5,374,564 (or EP-A-533551) and U.S. Pat. No. 6,020,252 (or EP-A-807970) (separation along an implanted region) or in the document EP 0925888 (separation by fracture along a buried layer that has been rendered porous). Whatever the exact technique used, the common feature of these variants is their use of molecular bonding, in most of the cases encountered in the literature between two substrates having silicon (Si) or silicon oxide ($SiO_2$) at the surfaces to be brought into contact. Other materials are sometimes encountered (nitrides, silicides, and the like).

If non-detachable SOI structures are to be obtained, the surface preparation operations are intended finally to provide, and often with the aid of annealing carried out after bonding, high bonding energies typically from 1 to 2 $J/m^2$. Conventionally, with standard preparation operations, the bonding energy of the structure is of the order of 100 $mJ/m^2$ at room temperature and 500 $mJ/m^2$ after annealing at 400° C. for 30 minutes, in the case of $SiO_2/SiO_2$ bonding (bonding energy determined by the blade method developed by Maszara (see: Maszara et al., J. Appl. Phys., 64 (10), p. 4943, 1988)). When the structure is annealed at a high temperature (1000° C.), the bonding energy can be as high as 2 $J/m^2$ (C. Maleville et al., Semiconductor wafer bonding, Science Technology and Application IV, PV 97-36, 46, The Electrochemical Society Proceedings Series, Pennington, N.J. (1998)). Other forms of preparation prior to bonding exist, for example exposure of the surfaces to be bonded to a plasma (for example an oxygen plasma), and can yield equivalent bonding energies without always necessitating such annealing (Y A, Li and R. W. Bower, Jpn. J: Appl. Phys., vol. 37, p. 737, 1998).

BRIEF SUMMARY

In contradistinction to the above, the inventors are interested in detachable SOI structures. It has been shown that different mechanical strengths can be obtained by modifying the hydrophilic properties and the roughness of the surfaces. For example, as indicated in a paper by O. Rayssac et al. (Proceedings of the 2nd International Conference on Materials for Microelectronics, IOM Communications, p. 183, 1998), hydrofluoric etching increases the roughness of a layer of silicon oxide. The paper describes how an 8000 Å etch increases the RMS roughness from 0.1 nm to 0.625 nm. It has been verified that $SiO_2/SiO_2$ bonding with RMS roughnesses of 0.625 nm and 0.625 nm for the facing surfaces yields a bonding energy value of the order of 500 mJ/m² after annealing at 1000° C., which is much lower than in the standard situation previously cited. The inventors have shown that in this case the roughening can be exploited to provide detachable bonding interfaces, even after annealing at high temperatures, as high as 1000° C. By astutely combining roughness preparation before bonding with suitable thermal annealing treatment, it has been demonstrated that detachable SOI substrates can withstand, without untimely separation at the assembly interface, most steps of a process for producing CMOS transistors (including in particular heat treatment steps at high temperatures, typically 1000° C., as well as steps of depositing constrained layers, for example layers of nitride), and could a posteriori be detached at the bonding interface by the intentional application of controlled mechanical stress.

Delamination is a well-known problem in the context of multilayer structures, in particular in the field of fabrication techniques for microelectronic components, sensors, and the like. This is because heat treatment, chemical treatment (hydrofluoric etching, and the like), mechanical and/or physical operations of removing materials (polishing, and the like) necessary for producing components, deposition and/or epitaxial growth steps, and the mechanical stresses generated during the production of non-homogeneous stacks, often generate cleavages at the layer edge or start lift-off at the edges of the structures. In the case of SOI, for example, the many hydrofluoric treatments used to deoxidize the Si surface can in some cases lead to important overetching of the buried oxide and thereby weaken the surface film at the edge of the wafer.

Layer transfer techniques (with or without components) based on the production of detachable substrates by forming an intermediate layer or fragile interface (whether by weakening by implantation of substances, by formation of a porous region, by control of the bonding energy, and the like) come up against certain problems associated with untimely delamination if the processing prior to intentional separation is too aggressive. Cracking can start unintentionally at the edges, during the process of fabrication of the whole or part of the component, and can reduce the yield. Apart from the reduction of the surface area of the active film caused by peeling of the film at the edge, these problems can lead to a high increase in particulate contamination of the wafers, and therefore a high reduction of yield in the fabrication of components and contamination of the plant used (in particular furnaces).

An object of the invention is to alleviate the drawbacks previously cited thanks to a layer/substrate interface that reliably combines the imperative of easy separation at the right time and the imperative of, where necessary, withstanding the application of heat or mechanical treatment necessary for the production of all or some of the microelectronic, optical, or acoustic components or sensors, or epitaxial growth steps, without causing premature separation or delamination.

More generally, the invention consists in a combination comprising a thin layer on a substrate, said layer being connected to said substrate by an interface or an intermediate layer having a controlled level of mechanical strength.

To this end it proposes, firstly, a method of preparing a thin layer including a step of producing an interface or an intermediate layer between said thin layer and a substrate, characterized in that said interface is produced so as to have a first region having a first level of mechanical strength and at least one second region having a second level of mechanical strength significantly greater than the first level.

In other words, the invention proposes a method of obtaining a structure having a buried structure (interface or layer) whose mechanical strength is higher in one region than in another. Thus the interface (or the intermediate layer) can be optimized as a function of requirements, allowing for processing that it is intended to apply to it.

Throughout this document, the expression "mechanical strength" means the mechanical strength in the "strength of materials" sense, but can also refer more generally to the susceptibility to rupture or dissociation of a continuous or discontinuous medium (such as an interface or a stack, which could suffer delamination, for example), whether this is in response to pure mechanical stress (traction, bending, shear, compression, torsion, and the like), during heat treatment, or during chemical attack, as well as all feasible combinations.

In the case of the particular problem discussed hereinabove, if it is required to detach the substrate from the layer at the correct time, and not before, the first region having a lower mechanical strength is a region included within the second region.

Especially when the whole of the thin layer is to be transferred, at the wafer scale, the region with the highest mechanical strength is preferably a ring (an annular ring in the case of round substrates), whose width can vary from a few hundred micrometers to a few millimeters, or even be of the order of one centimeter. Thus the ring can constitute the periphery of a round, square, polygonal or other shape plate whose core is of lower mechanical strength.

In a situation corresponding instead to separation at the level of portions of the thin layer (by die, by component, set or subset of dies, and the like), the preparation of said layer preferably includes a step wherein at least one fragment of said layer is isolated on the substrate and said second region extends along the contour of said fragment. Thus the first region can be fragmented, each fragment being surrounded by a region of greater mechanical strength.

Accordingly, the interface or intermediate layer produced between the thin layer and the substrate is mechanically weaker in its central portion that at its periphery. This greatly reduces the risk of untimely delamination.

The interface or buried layer according to the invention can take various forms. It can in particular be defined as:

a bonding interface (with or without adhesive, for example bonding by molecular adhesion), and with or without an intermediate layer (oxide, nitride), a layer of microcavities (and/or gas microbubbles and/or platelets), and more generally a layer of defects, an intermediate layer having characteristics different from those of the substrate and the layer, for example a porous silicon layer, which can be differentiated in terms of its mechanical strength or its susceptibility to chemical etching (chemical and mechanical), and the like, and an intermediate layer of different chemical composition intended to be selectively chemically etched.

The differentiation between connecting regions of higher or lower mechanical strength or other different kinds of connections can be effected:

in the case of a bonded interface, by connecting energies obtained, for example, by different preparation before bonding (roughness, different hydrophilic properties, chemical surface connecting states, and the like) and/or by heat treatment differences, in particular after bringing into contact for bonding, in the case of a layer of microcavities, by reduced implantation dosing in the second region or by preferential growth of microcracks in the first region, in the case of a porous layer, by modifying the percentage porosity so that it is higher in the first region, in the case of an intermediate layer of different chemical composition, intended to be selectively chemically etched, by varying the chemical composition, which can be a doping difference or a composition percentage difference for a semiconductor substance, for example, which would have a direct impact on any variation in sensitivity to chemical etching.

To be more precise, in the situation where there are only two regions, in accordance with preferred features of the invention, possibly in combination (in which case the second region surrounds the first region):

After the step of producing the interface there are effected a step of isolating a fragment of the layer containing said first region and said second region so that said second region runs along the periphery of said fragment, followed by a separation operation in which the substrate and the thin layer are lifted off; in this case, the lift-off step is sometimes advantageously preceded by a step of physical delimitation of the second region vis à vis the first region, for example after partial or total cutting, by total or partial chemical etching, by total or partial mechanical fracture, and the like.

The interface is produced between a surface of the substrate and a surface of the layer, and the step of producing the interface includes a step of preparing at least one of these surfaces and a bonding step during which that surface is bonded to the other surface by molecular adhesion bonding; the step of producing the interface preferably and advantageously includes a preparation step for each of the substrate and layer surfaces. The surface preparation step preferably includes a treatment step during which said surface in said first region is made less hydrophilic or its roughness is locally increased, for example; this refers, for example, to localized acid etching of the surface in this first region; to be more precise, it is even more preferable if at least one surface includes an oxide layer and the acid etching is effected with hydrofluoric acid, the surface in this second region being protected from said etching by a protection (for example nitride) layer which is eliminated afterwards. In another variant, the surface of at least one of the two wafers is entirely roughened and in some portions the roughness is then modified, essentially improved, to obtain greater bonding forces, for example with the aid of chemical polishing treatment, mechanical or chemical-mechanical or ionic treatment, or by dry etching.

To prepare the surface and control the roughness, especially if one of the surfaces is an oxide, partial acid etching can be effected using hydrofluoric acid.

The step of producing the interface includes a step of weakening a buried layer in a starting substrate, whereby at least the first region is made weaker than the second region, said buried layer being disposed between a portion forming the layer and a portion forming the substrate. The weakening step preferably includes a step of implanting at least one element, preferably a gas, this implantation step being conducted in a different way for the first and second regions.

The step of producing the interface or intermediate layer includes a treatment step adapted to render a surface layer of the substrate porous, this treatment step being conducted in a different manner for the first and second regions, followed by a coverage step in which the layer is produced on top of said porous layer. In the particular case where the substrate is of silicon, this treatment step advantageously includes electrolysis in a hydrofluoric acid medium.

The mechanical and/or chemical strength of the interface or connecting layer is modified by non-uniform heat treatment to selectively strengthen or selectively weaken some regions compared to others, according to whether it is a matter of bonding roughened surfaces, porous materials, buried defects, gaseous or other microcavities.

The step of producing the interface is followed by a step of separating the layer from the substrate. Between the step of producing the interface and the lifting off step, there is advantageously a bonding step during which the layer is bonded to a second substrate. Said bonding step advantageously consists of molecular adhesion bonding or adhesive bonding, in the latter case using an adhesive hardened by UV, a resin, or a polymer adhesive, for example. In these cases, the separation step is advantageously effected by acid etching and/or application of mechanical stress.

The layer is of semiconductor materials (Si, Ge, SiGe, SiC, GaN and other equivalent nitrides, AsGa, InP, Ge, and the like) or ferro-electric materials or piezo-electric materials ($LiNbO_3$, $LiTaO_3$), or processed or unprocessed magnetic materials.

The thin layer on the separable substrate was obtained by thinning an original semiconductor material substrate.

The thinning is obtained by machining and/or chemical-mechanical or other polishing and/or chemical etching.

The thin layer on the separable substrate was obtained by cutting into the original semiconductor material substrate.

The cutting is achieved by cutting at the level of a buried weak layer.

The buried weak layer is obtained by implantation and separation is obtained by heat and/or mechanical and/or chemical treatment.

The substance implanted is a gas (hydrogen, helium, and the like).

In terms of product, the invention proposes an assembly comprising a layer on a substrate, said layer being connected to said substrate by an interface of which at least a first chosen region has a first level of mechanical strength and a second chosen region has a level of mechanical strength significantly higher than the first level, and the second region surrounding the first region.

According to preferred features, which may be combined:

A fragment is totally or partially delimited (by cutting, etching, and the like) in said layer containing said first region and said second region so that said second region runs along the periphery of said fragment.

The interface is produced between a surface of the substrate and a surface of the layer that are bonded by molecular adhesion. At least one surface of the interface has a lower roughness in said second region than in the first region.

The interface is formed by a buried layer in an original substrate, the first region being weakened more than the second region.

The interface is formed by a porous layer between said layer and said substrate, said layer having differences of porosity between said first and second regions.

Said layer is further bonded to a second substrate, advantageously by molecular adhesion bonding or adhesive bonding, for example by an adhesive hardened by UV radiation.

The mechanical and/or chemical strength of the interface or connecting layer is selectively modified with the aid of treatments (heat treatments, UV exposure treatments, laser irradiation treatments, and the like) that are localized or non-uniform to selectively strengthen or selectively weaken some regions more than others, according to whether it is a question of bonding roughened surfaces, porous materials, buried defects, or gaseous or non-gaseous microcavities.

The layer is of semiconductor materials (Si, Ge, SiGe, SiC, GaN and other equivalent nitrides, AsGa, InP, and the like) or ferro-electric or piezo-electric materials (LiNbO$_3$, LiTaO$_3$), or processed or unprocessed magnetic materials.

BRIEF DESCRIPTION OF THE DRAWING

Objects, features and advantages of the invention will emerge from the following description, which is given by way of non-limiting illustrative example and with reference to the accompanying drawings, in which:

FIG. 33 is an alternate embodiment of the assembly of FIG. 30, after cutting of trenches or notches between components, FIG. 34 illustrates the assembly of FIG. 33 showing a component in the process of being lifted off, for example after hydrofluoric etching, FIG. 35 is a view of an assembly analogous to the assembly illustrated in FIG. 4, FIG. 36 illustrates the assembly of FIG. 35 after adhesive bonding of a transparent substrate, FIG. 37 is a view of the lower portion of the assembly illustrated in FIG. 36 after lifting off, FIG. 36 is a view of the upper portion of assembly illustrated in FIG. 37 after lifting off and polishing.

DETAILED DESCRIPTION

1—Molecular Adhesion Bonding Interface

The preferred examples selected for the detailed description primarily relate to silicon, which is generally available in the form of round substrates, for example of 200 mm diameter. These methods transfer readily to other systems characterized in particular by materials other than silicon, in a non-limiting manner and without departing from the scope of the invention.

Some embodiments of the method according to the invention tend to encourage lifting of the layer off its substrate at the overall level, more specifically on the scale of the whole of the substrate, while others tend to delimit fragments.

Figure 1:
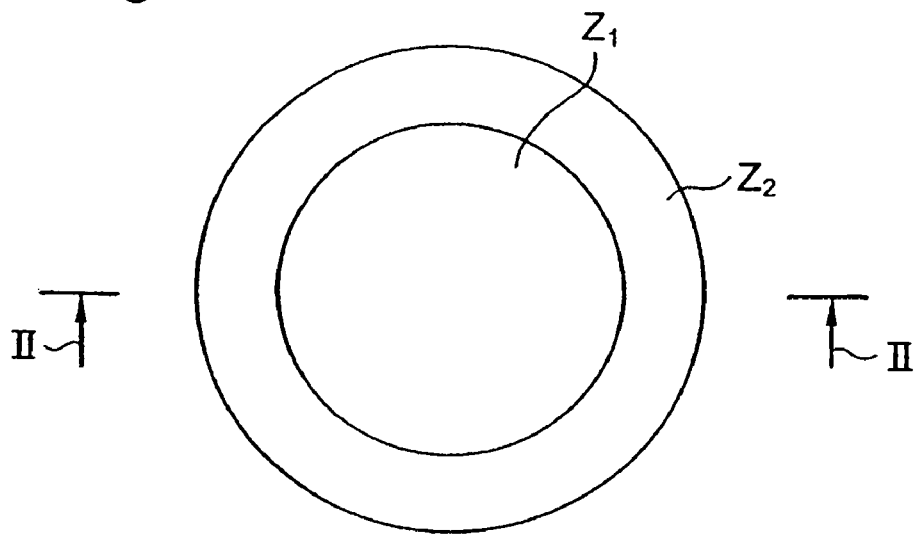
FIG. 1 is a diagrammatic partial plan view of a surface on which two regions are prepared so that they have different molecular bonding characteristics.
Figure 2:
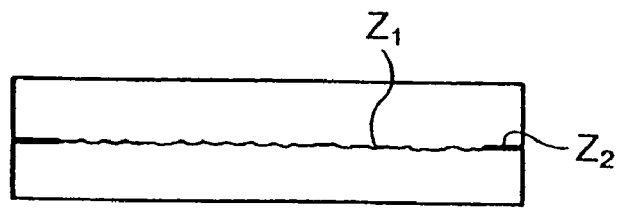
FIG. 2 is a view in section taken along the line II-II in FIG. 1.

An assembly to be produced in the former case is shown diagrammatically in FIGS. 1 and 2, the interface or intermediate layer shown diagrammatically in FIG. 2 representing the region in which local bonding differences are to be created. In addition to these figures, FIG. 3 in particular shows one example of the preparation of a surface intended to participate in an interface having, in accordance with the invention, two regions having different mechanical strengths. To be more precise, in the example shown, the object is to obtain a central region $Z_1$ whose mechanical strength $E_{c1}$ is less than that $E_{c2}$ of a peripheral region. $Z_2$ around the central region.

Figure 4:
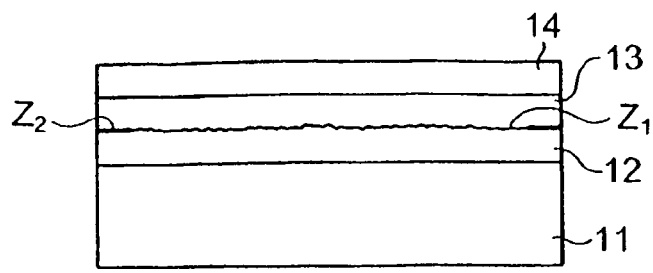
FIG. 4 is a diagrammatic view in section of the whole of a thin layer on a substrate.
Figure 19:
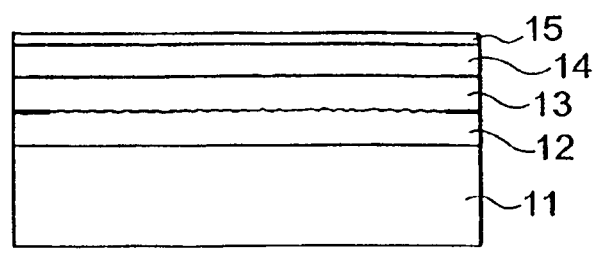
FIG. 19 is a diagrammatic view of the assembly of FIG. 4 after depositing a surface layer.

Different methods can be used to obtain a higher bonding energy in the peripheral region $Z_2$ than in the central region $Z_1$. Examples of $SiO_2/SiO_2$ and $Si/SiO_2$ bonding are considered. In the case of layers of different kinds ($Si_3N_4$ is another conventional example, but there are also silicides), and by analogy with what is described hereinafter, it suffices to use appropriate chemical treatment (for example $NH_4OH/H_2O_2/H_2O$ (also known as SC1) for Si and $H_3PO_4$ or HF for $Si_3N_4$). FIG. 4 shows the option in which the substrate 11 and the thin layer 14 are of monocrystalline silicon and two intermediate layers 12 and 13 are formed prior to bonding on the substrate 11 and the thin layer 14, respectively. Of course, only one of the two intermediate layers 12 or 13 may suffice, and the situation in which neither of them exists (i.e. that of Si/Si bonding) must be considered (i.e. there are two special cases). If the intermediate layers 12 and 13 exist and are both of $SiO_2$, the system is referred to as $SiO_2/SiO_2$ bondinG. If only one of the two exists, and consists of $SiO_2$, then the system is referred to as $Si/SiO_2$ bonding.

A number of techniques can be employed to produce a structure like that shown in FIG. 4, in addition to technical aspects related to molecular adhesion bonding, including those previously cited, for the production of non-separable SOI substrates (see Semiconductor Wafer Bonding, Science and Technology, Q. Y. Tong and U. Gosele, Wiley Interscience Publications). Hereinafter the layer 14 is referred to as the active layer, being the layer comprising the components, except for certain special cases in which an additional, for example epitaxial, layer is deposited onto the layer 14. In some variants of the invention, the thin layer is obtained by thinning the structure chemically and/or mechanically. These variants are known as bonded SOI (BSOI) and bond and etch back SOI (BESOI). In addition to molecular adhesion bonding, these variants are based on physical removal of the original substrate by polishing techniques and/or chemical etching techniques. Other variants, partially described hereinbefore as layer transfer techniques, are based, in addition to molecular adhesion bonding, on separation by "cutting" or cleaving along a weakened region, such as the methods described in the documents U.S. Pat. No. 5,374,564 (or EP-A-533551) and U.S. Pat. No. 6,020,252 (or EP-A-807970): separation along an implanted region, or in the document EP 0925888: separation by fracture along a buried layer that has been rendered porous.

With reference to specific aspects related to bonding for the production of separable substrates, in the case of $SiO_2/SiO_2$ (or even $Si/SiO_2$) bonding, a temporary mask can first be used to deposit a protection layer, for example a layer of silicon nitride $Si_3N_4$, onto only the ring of the silicon oxide $SiO_2$ layer(s) 12 and/or 13. The oxide layer can be prepared in several ways (deposition, thermal oxidation of the silicon) and can have a thickness that varies according to the application. For this example, a 1 µm thick thermal oxide is chosen. The following structure is therefore obtained: the surface of the central disc is formed of oxide only and the surface of the external ring (which is typically a few mm wide) is formed of the oxide covered with an additional protection layer (for example of nitride).

This is followed by hydrofluoric acid etching to roughen the surface of the oxide, the roughening required increasing with the thickness of oxide removed. For each application, the roughness can be optimized, in particular as a function of the method of producing the components (or of epitaxial growth), which must be formed without delamination, and the method adopted for the final separation. Typically, hydrofluoric acid etching to remove a thickness of oxide of the order of a few hundred to a few thousand Å is a good starting compromise. A nitride thickness of the order of 1000 Å protects the underlying oxide from hydrofluoric acid etching, which increases the roughness of the central region of the oxide layer(s) 12 and/or 13. The nitride is subsequently removed by etching with hot (>110° C.) orthophosphoric acid ($H_3PO_4$), for example. This can be combined with selective wet or dry cleaning to obtain different hydrophilic properties between the regions $Z_1$ and $Z_2$. The resulting effect is one of weaker bonding than the standard bonding at the center and bonding identical to the standard bonding at the location of the ring.

Figure 3:
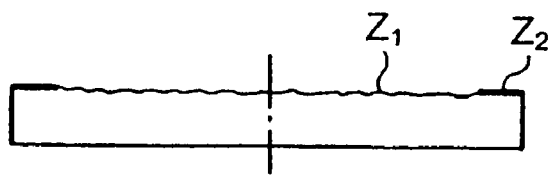
FIG. 3 is a view of a combination comprising a thin layer on a substrate with an interface in accordance with FIG. 1.

If the oxide removed is thick, in particular because the application requires this (especially in the range of a few thousand Å, knowing that 5000 Å is a good starting compromise in many cases), it must be noted that in addition to the required effect of locally increased roughness, a difference in level is created between the central region (which has been hydrofluoric acid etched) and the ring (which has been protected from this etching). To obtain bonding of very high quality in the ring, in combination with bonding of satisfactory quality in the central region, it may be necessary to eliminate or reduce the difference in level in some cases. It can be appropriate to use polishing for this (for example chemical/mechanical polishing). Because of the difference in level, polishing that is a priori uniform results, through a planarizing effect that is well known to the person skilled in the art of microelectronics, in preferential polishing of the emergent region, i.e. the region of the ring in the present instance. However, the polishing can also be intentionally localized to the rinG. If the substrate is circular, the ring can be preferentially polished by using a polishing cloth with a central opening, for example, thereby reducing the level of the ring to that of the central region that has been hydrofluoric acid etched. Moreover, it is known that polishing leads to higher bonding energies than are obtained by conventional molecular adhesion bonding (with no polishing). This therefore combines two effects tending toward weaker bonding than the standard bonding at the center and stronger bonding at the location of the rinG. This combination is another special case of what is shown in FIG. 3. Another way to reduce the level of the ring to that of the center is localized wet or dry etching.

An alternative to this is to roughen all of the intermediate layer(s) 12 and/or 13, more specifically without protecting the ring, but to add treatment localized to the ring that significantly increases the bonding strength. These treatments include, for example, the use of an oxygen plasma or localized annealing, one aim of which would be, through a flow effect, to reconstruct and reduce the roughness of the surface of the oxide, or any other treatment known to the person skilled in the art to improve the cohesion of the assembly. These treatments have the advantage that they do not create any relief.

Another alternative relates to the use of localized thermal annealing (laser beam, non-uniform furnaces, heating by lamps, and the like) after the bonding operation. As reported in C. Malevill et al., Semiconductor wafer bonding, Science Technology and Applications IV, PV 97-36, 46, The Electrochemical Society Proceedings Series, Pennington, N.J. (1998), a 100° C. annealing temperature difference after bonding can significantly vary the bonding energy, especially in the range of temperatures beyond 800° C. This alternative can be used in combination with roughening at least one intermediate layer 12 or 13, or alone (more specifically with no step of roughening everything). One very specific example, that must not in any way be regarded as limiting on the invention, applied to $SiO_2/SiO_2$ bonding is to anneal the whole of the structure at 1000° C. and to heat the ring selectively to 1200° C. Another is not to anneal the whole of the ring at a temperature of 1000° C. For this selective annealing alternative, it must be understood that, because of thermal conduction phenomena and the difficulty of producing equipment for localized heating with perfect selectivity, localized heating can result in a heat input gradient. In this case, the annealing temperature can be considered to be at a maximum at the edges of the substrate and to fall on approaching the center of the substrate.

Another variant of the method of producing a separable substrate can be based on a difference in chemical nature between the region $Z_1$ and the region $Z_2$. The following pairs may be cited by way of non-exhaustive example: $Z_1=SiO_2$ and $Z_2=Si$; $Z_1=Si_3N_4$ and $Z_2=SiO_2$; $Z_1=Si_3N_4$ and $Z_2=Si$, and the like. Only the pair $Z_1=SiO_2$ and $Z_2=Si$ is described here.

Figure 5:
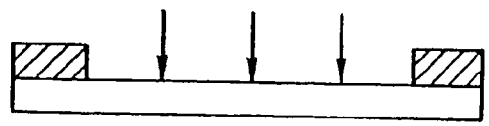
FIG. 5 is a view in section of a substrate wafer provided with a protective layer.

As shown in FIG. 5, a protective ring (of resin, deposited PECVD, and the like) a few mm wide is deposited onto a silicon substrate to define the dimensions of the region $Z_2$.

Figure 6:
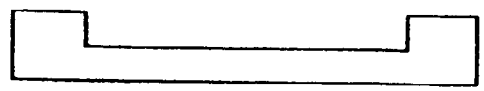
FIG. 6 is a view of the wafer illustrated in FIG. 5 after recessing it.

The structure is then etched (wet or dry, by any of the techniques conventionally employed to etch silicon) so that the etching attacks only the unprotected region. Mechanical attack (milling, polishing, and the like.) can also be envisaged so that only the center is machined, by virtue of the configuration and/or size of the tool employed. In the above cases, the operation of depositing a protection layer is no longer indispensable. Regardless of the method employed (possibly involving a step of removing the protective ring), a silicon wafer is obtained with a recess at the center, as shown in FIG. 6.

This defines the location of the region $Z_1$ (disc with recess) and the region $Z_2$ (outer ring).

Figure 7:
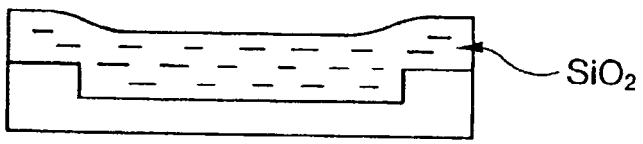
FIG. 7 is a view of the wafer illustrated in FIG. 6 after filling the recess with a deposit of oxide.

An oxide is deposited by the CVD process on the resulting substrate with a recess. The thickness of the layer of oxide deposited is much greater than the depth of the recess, producing the structure shown in FIG. 7.

Figure 8:
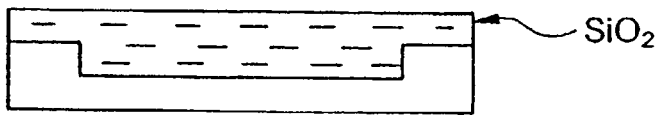
FIG. 8 is a view of the wafer illustrated in FIG. 7 covered with the oxide deposit after polishing.
Figure 9:
FIG. 9 is a view of the wafer illustrated in FIG. 8 after elimination of surplus oxide coating.

Planarizing by polishing eliminates the difference in level between the ring and the center of the structure as well as the high inherent roughness of this type of deposit (see FIG. 8). Hydrofluoric acid etching then produces the structure shown in FIG. 9. In this case, hydrofluoric acid etching is stopped when the silicon is flush with the rinG. This produces a "silicon ring and roughened oxide at the center" configuration, which defines an energy difference between the regions $Z_1$ and $Z_2$, firstly because these two regions have different roughnesses and secondly because the nature of the material is different (different molecular adhesion bonding properties).

Depending on the energy difference required between the regions $Z_1$ and $Z_2$, the above sequence can be modified to yield a "silicon ring and non-roughened oxide at the center" configuration. To this end, the hydrofluoric acid etching step can be eliminated, for example, and the previous polishing step extended so that polishing the silicon ring results in a flush surface. In this case, the energy difference between the regions $Z_1$ and $Z_2$ is essentially caused by the difference in the nature of the materials. In this case, the difference is smaller.

Figure 10:
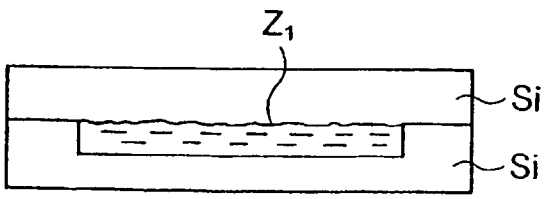
FIG. 10 is a view of the wafer illustrated in FIG. 9 after fixing a thin layer or after fixing a thick layer and then thinning it.

A recess and an oxide deposit have been cited in the situation where they are produced on the substrate 11 (with the result that the FIG. 10 configuration is obtained after bonding). A variant consists in carrying out these operations on the side of the thin layer 14 (see FIG. 12), or even on both sides (see FIG. 11).

Methods for other pairs of materials that can exhibit a difference in mechanical strength can include a small number of additional steps. For example, if the aim is to obtain the pair $Z_1=Si_3N_4$ and $Z_2=SiO_2$, $Si_3N_4$ must be deposited in addition to the oxide, taking care to define the required ring for the whole of the structure using conventional masking techniques (photolithography, mechanical methods, and the like). This structure has the advantage of excellent chemical etching (for example hydrofluoric acid etching) selectivity between the two materials concerned, which could facilitate separation through easy and selective removal of the ring by chemical etching.

Figure 11:
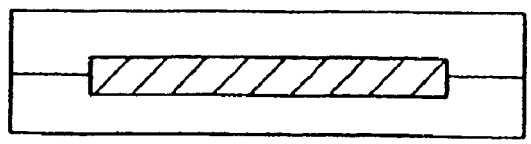
FIG. 11 is an alternate embodiment of FIG. 10, in which the oxide coating penetrates into the substrate and into the thin layer.
Figure 12:
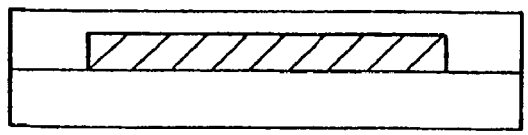
FIG. 12 is an alternate embodiment of FIG. 10, in which the oxide coating is on the thin layer.
Figure 13:
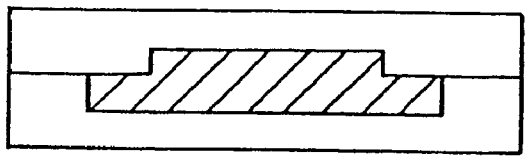
FIG. 13 is an alternate embodiment of FIG. 11, in which the oxide occupies different regions in the substrate and in the thin layer.
Figure 14:
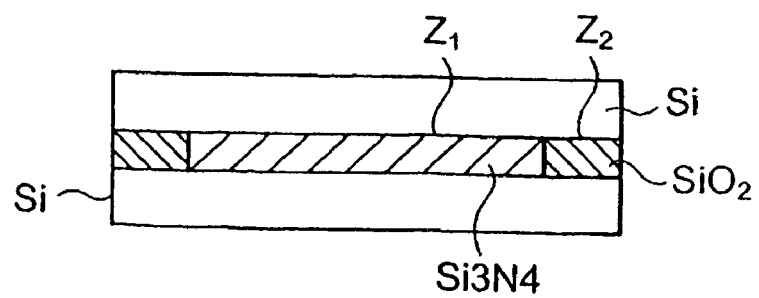
FIG. 14 shows an alternate embodiment in which the interface is formed of a layer formed by regions of different materials (in this example SiO$_2$ and Si$_3$N$_4$)
Figure 15:
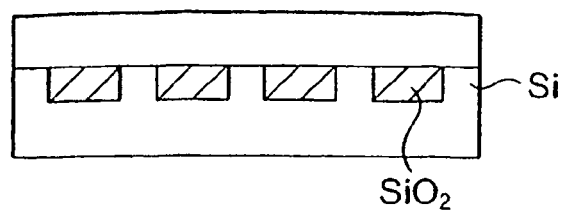
FIG. 15 is an alternate embodiment of FIG. 10, showing a plurality of regions formed by the oxide.
Figure 16:
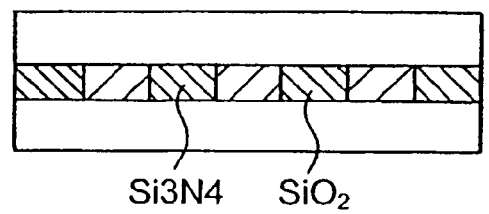
FIG. 16 is an alternate embodiment of FIG. 14, showing an intermediate layer formed of a plurality of regions of different materials.

Other configurations are possible, for example:

FIG. 13 is a variant of FIG. 11 in which the central layer does not have the same dimensions in the substrate and in the thin layer, FIG. 14 shows an assembly in which the interface layer between the substrate and the thin layer has a central portion $Z_1$ of a material ($Si_3N_4$) different from that ($SiO_2$) of the peripheral portion $Z_2$, these two portions being of different materials (here Si) than the substrate and the thin layer, FIG. 15 is a variant of FIG. 10 in which there is a plurality of regions $Z_1$ of a material different from that of the support, FIG. 16 is a variant of FIG. 14 in which there is a plurality of regions $Z_1$ and a plurality of regions $Z_2$ of materials (here $Si_3N_4$ and $SiO_2$) different from those (here Si) of the substrate and the thin layer.

Figure 17:
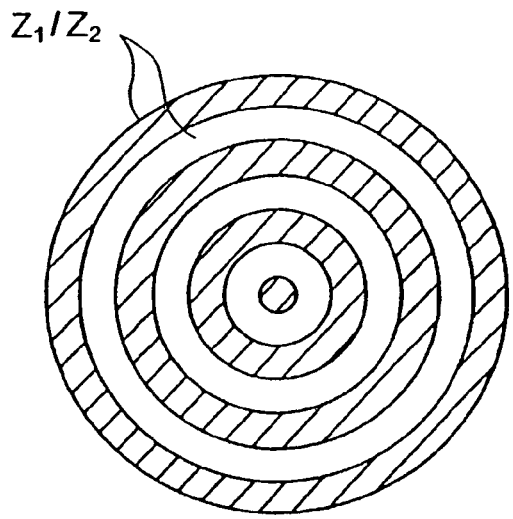
FIG. 17 illustrates an embodiment having concentric and alternating rings $Z_1$ and $Z_2$.
Figure 18:
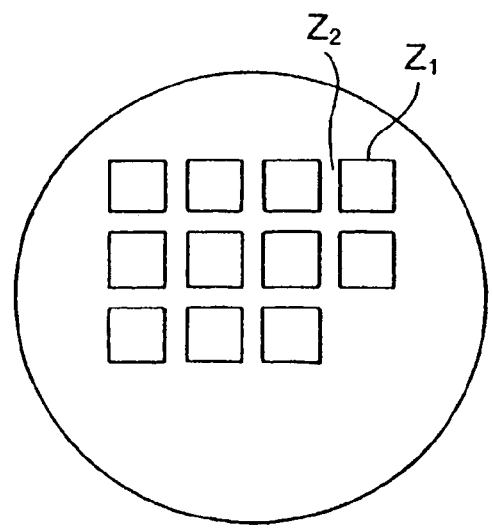
FIG. 18 illustrates an embodiment having an array of regions $Z_1$ in an overall region

FIGS. 15 and 16 can correspond to a plurality of geometries of which FIGS. 17 and 18 are examples (at the die level or otherwise):

FIG. 17 shows a configuration with a plurality of concentric bands $Z_1$ or $Z_2$, and FIG. 18 shows a configuration having an array (made up of rows and columns) of regions of one type (here $Z_1$) in an overall region of the other type ($Z_2$).

Apart from the production of the separable substrate itself, using techniques based on molecular bonding, there are several means as to its use and to the means to implement it.

The benefit of the separable substrate, depending on the thickness of the unprocessed active layer or of the processed active layer (i.e. its thickness when it has been processed to produce all or part of a component), is that it allows separation of the active layer to obtain either a self-supporting layer (a relatively thick layer, whether the thickness is already present in the separable substrate as manufactured or obtained during deposition steps subsequent to its fabrication, as is the case in an epitaxial growth step) or a surface layer, which is generally thinner, transferred onto a target support, whether the latter is the final support or merely a temporary support which is itself intended to be detached.

There are various ways to transfer the surface layer to the target substrate.

First of all, transfer can be effected by molecular adhesion bonding of what is to become the thin layer to be transferred to another substrate.

By way of illustration, a separation method is described next in the context of producing a new SOI structure that is referred to herein as the second SOI structure. This kind of method, a priori less direct than the techniques previously mentioned, nevertheless has a number of benefits. The example chosen here relates to the production of a second SOI substrate with a buried oxide layer 500 Å thick, which thickness is difficult to obtain using this kind of method directly.

Figure 20:
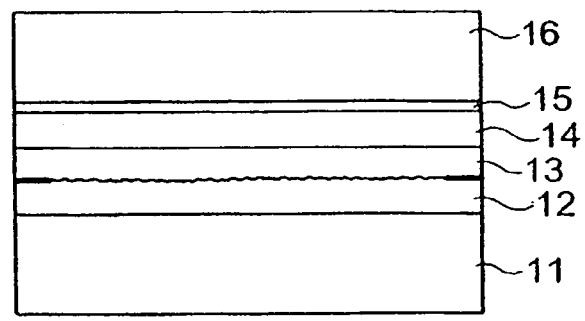
FIG. 20 illustrates the assembly of FIG. 19 after molecular bonding of a final substrate.
Figure 21:
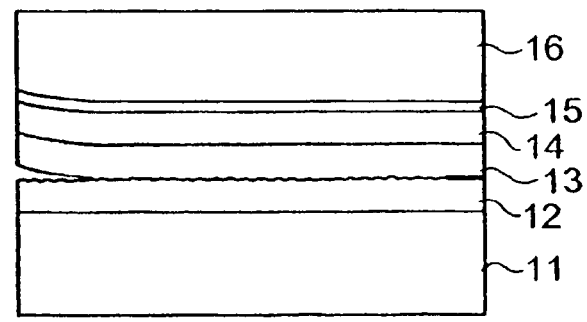
FIG. 21 illustrates the assembly of FIG. 20 during application of a lift-off operation.
Figure 22:
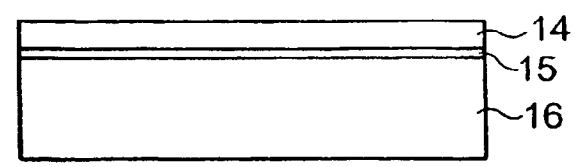
FIG. 22 is a diagrammatic view of a wafer obtained after lifting off of the assembly of FIG. 20 and subsequent polishing.

The first structure is obtained by one of the methods previously described, yielding a separable substrate corresponding to FIG. 4. In this example the monocrystalline silicon layer 14 is to become the active layer. Onto this separable substrate, in which the central region of the connecting layer has been roughened before bonding and has not undergone any strengthening heat treatment at very high temperatures (preferably less than 1000° C. and even better less than 1000° C. or even 900° C.), a 500 Å oxide layer is formed by thermal oxidation to yield the structure shown in FIG. 20. This oxide is to become the buried oxide of the second SOI structure. In the present example, the separable substrate (11+12+13+14+15) is molecular adhesion bonded to a silicon substrate 16 that is to become the final support of the active layer (see FIG. 2). The stack obtained is preferably stabilized at a high temperature (1000° C.) to consolidate strongly the second bond at the interface of the layers 15 and 16. This second bond is conventional in the sense that there is no differentiation between regions of different mechanical strength. The first bond, if subjected to the same treatment, nevertheless has, at least in its central portion, corresponding to the region $Z_1$, a mechanical strength less than that of the second bond. A chemical and/or mechanical separation method can be used. For example, the stack obtained as above is first immersed in a hydrofluoric acid bath, one object of which is to overetch the oxide layers 12 and 13, starting from the edges of the assembly, to eliminate the ring corresponding to the region $Z_2$ and reach the region $Z_1$. The two interfaces 12/13 and 15/16 are preferentially etched. Moreover, the interface 12/13 of the separable substrate is advantageously an oxide/oxide interface. It therefore yields more readily than the interface 15/16 between the oxide and the silicon. Accordingly, during this step of lifting off the ring of higher mechanical strength, there is less surface etching at the interface of the second bond than at the interface of the separable substrate. When the acid reaches the low energy region (the central region, see FIG. 21), mechanical separation (by pressurized water jet, as in the document EP 0925888, by compressed air jet, as in the document FR 2796491, by traction, as in the document WO 00/26000, by insertion of a blade, and the like) completely frees the final structure 13+14+15+16 (see FIG. 22). Following removal of the oxide 13, for example by hydrofluoric etching, the final SOI structure is obtained. The Si wafer 11 that served as a substrate within the separable substrate can be recycled and reused, for example to produce another separable substrate (preferably after eliminating the layer 12).

Figure 39:
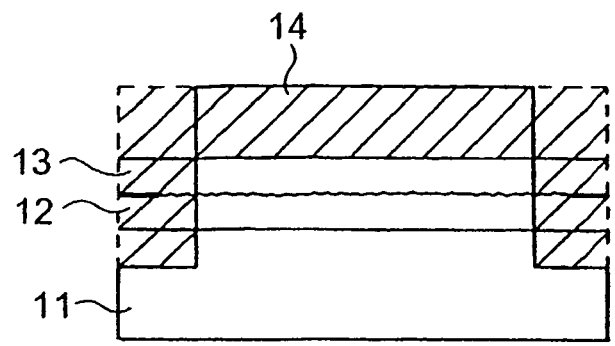
FIG. 39 is a view of an assembly analogous to that of FIG. 4 showing regions eliminated by chemical and mechanical cutting.
Figure 40:
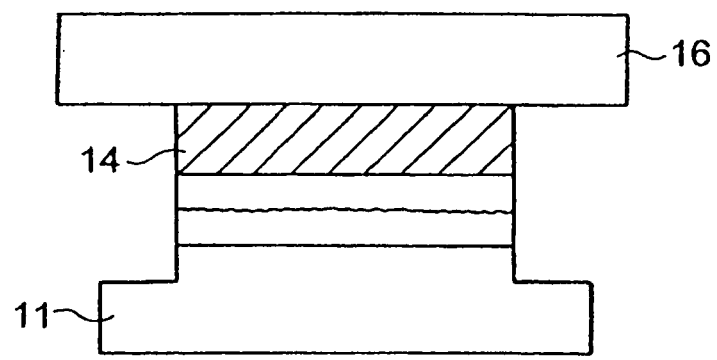
FIG. 40 illustrates the assembly of FIG. 39 after bonding an upper substrate.

Other means of eliminating a ring to obtain access to the region $Z_1$ can at least partially eliminate the rinG. Wet or dry chemical etching techniques or other mechanical polishing, laser cutting, and the like techniques can be employed for this, localized to the ring (see FIGS. 39 and 40, which correspond to the production of a mechanical or chemical cut (cross-hatched area), before bonding the second substrate).

Note that the 500 Å thick buried oxide layer 15 formed previously on the layer 14 could have been formed on the substrate 16 before bonding rather than on the layer 14. Another variant divides the 500 Å thickness into two portions, with one portion on the substrate 16, for example 250 Å thick, and the other portion on the layer 14, also 250 Å thick in this example.

Note that if the two molecular adhesion bonded interfaces are both of the oxide/oxide type, stabilization of the second bond at high temperature can be carried out in such a way as to guarantee that preferential hydrofluoric acid etching occurs at the first interface. In this method, the creation of a mechanically weak region $Z_1$ achieves preferential separation of the complete stack at the first bond interface, and the region $Z_2$ firstly yields an active layer 14 of good quality and secondly prevents the onset of cracks that can cause losses of yield and a reduction in the surface of the active film caused by peeling of the film at the edge, and thus a strong increase in particulate contamination of the wafers.

Figure 23:
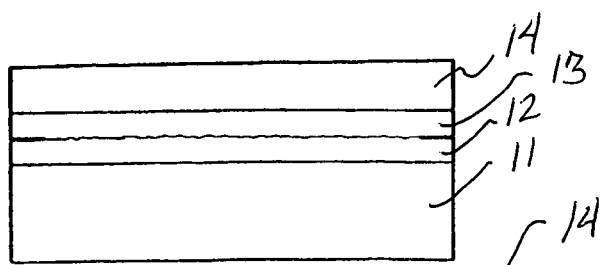
FIG. 23 is a view of a separable assembly of the embodiment illustrated in FIG. 4.
Figure 24:
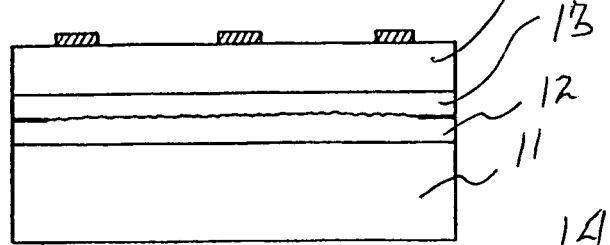
FIG. 24 illustrates the assembly of FIG. 23 after production of some or all of the components, for example a first transistor gate.
Figure 25:
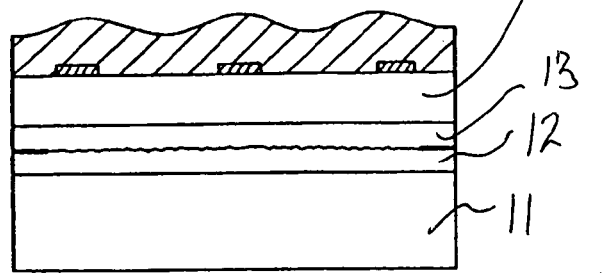
FIG. 25 illustrates the assembly of FIG. 24 after deposition of oxide.
Figure 26:
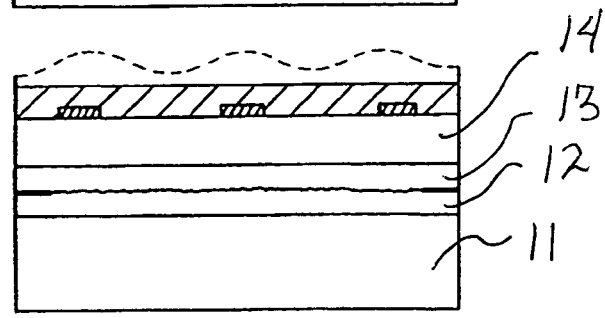
FIG. 26 illustrates the assembly of FIG. 25 after planarization by CMP.
Figure 27:
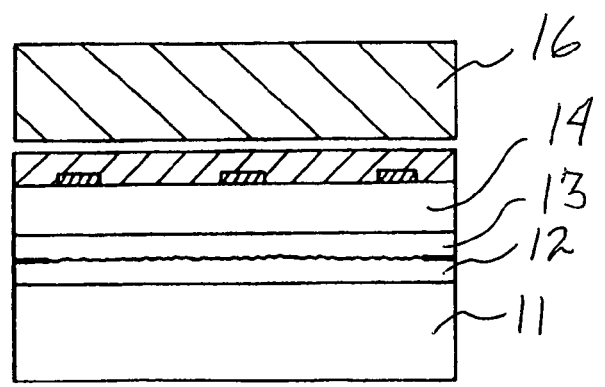
FIG. 27 illustrates the assembly of FIG. 26 after molecular adhesion bonding (including heat treatment)
Figure 28:
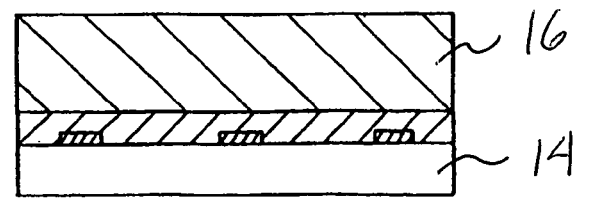
FIG. 28 illustrates a portion of the assembly of FIG. 27 after separation and deoxidization.
Figure 29:
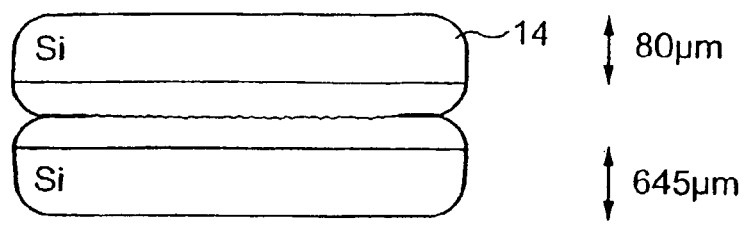
FIG. 29 is a view of a separable assembly of the embodiment illustrated in FIG. 4.
Figure 30:
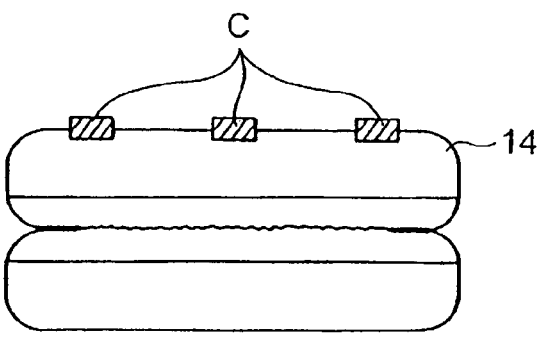
FIG. 30 illustrates the assembly of FIG. 29 after production of components.

Another example of the use of the method according to the invention relates to the production of double-gate transistor structures. The first operations relating to the fabrication of the transistors essentially consist in producing the first CMOS transistor gate (see FIG. 24) on a separable substrate using conventional technology (see FIG. 23), as shown in FIG. 4, for example, in exactly the same way as previously described for the production of SOI structures with a thin buried oxide layer. The bonding stabilization temperature can be reduced in a temperature range of the order of 900° C. to 1000° C. An oxide layer with a thickness of the order of 1 µm is then deposited onto this substrate (see FIG. 25) using a conventional deposition technique (for example CVD). The oxide is planarized using a conventional chemical/mechanical polishing technique (see FIG. 26). This is followed by molecular adhesion bonding to another silicon substrate 16 (see FIG. 27). The bonding is preferentially stabilized at a temperature from 1000° C. to 1100° C. if the structures formed for the first gate can withstand this high a temperature, or at temperatures of the order of 900° C. to 1000° C. otherwise. Finally (see FIG. 28), separation is carried out in exactly the same way as previously (insertion of a blade, pressurized water jet, compressed air jet, etc.). Before resuming the transistor fabrication process, in particular to produce the second gate (on the new "substrate" shown in FIG. 28), the remainder of the oxide layer 13 is removed by chemical etchinG. Because the oxide is etched with a hydrofluoric acid solution of known etching selectivity with respect to silicon, etching stops naturally once the oxide has been entirely etched, revealing a silicon surface. The major advantage of this technique over other fracture techniques, for example obtained by way of implantation, is that it does not necessitate excessively complex finishing sequences that are problematic in terms of their potential to create defects, as for a final polishing operation, for example. The remainder of the double-gate transistor fabrication process will be obvious to the person skilled in the art.

The same process can be used in many other applications. If the first SOI structure (see FIG. 4) is used to produce transistors, circuits, components, and the like, these can be finally transferred onto many types of dedicated support. For example, the substrate 16 can be chosen for its electrical insulation properties (high-resistivity silicon, quartz, sapphire, and the like) to provide an ideal support for microwave and telecommunication circuits, thereby limiting losses in the substrate. For applications relating to flat screens, a transparent substrate is chosen for the final support.

Figure 31:
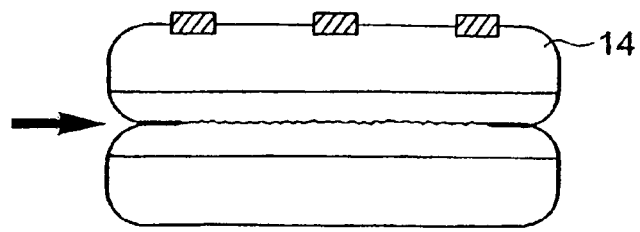
FIG. 31 illustrates the assembly of FIG. 30 after separation with no transfer to a target substrate, by hydrofluoric etching and/or application of mechanical forces.
Figure 32:
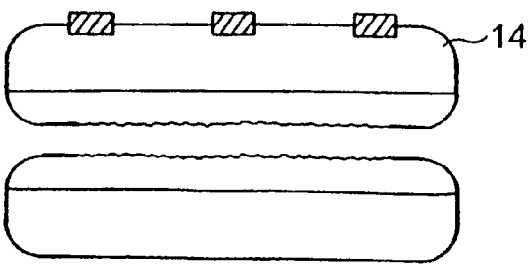
FIG. 32 illustrates the assembly of FIG. 31 after separation into a final substrate and a substrate that can be recycled.

Another example of separation is briefly described here (see FIGS. 29 to 32) in the case of producing circuits on thin substrates. The final thicknesses of interest are typically less than a few hundred µm, even of the order of a few tens of µm. They relate, for example, to power applications or applications to smart cards and other circuits for which some flexibility is required (plastics material supports, curved supports, and the like). One variant relates to a type of separation necessitating no transfer to a target substrate. Here the object is to achieve separation without transferring the layer 14 after producing the circuits or components C, when the layer 14 is sufficiently thick to be self-supporting but too thin to withstand without damage a circuit production process (typically less than a few hundred μm thick, and even of the order of a few tens of μm). The method of producing the separable substrate is identical in every respect to any of those described previously to produce the FIG. 4 structure, for example. In the case of 200 mm diameter silicon wafers, the standard substrate thickness is 725 μm. If the application requires a final substrate thickness of 80 μm, for example, a silicon substrate of 645 μm (725−80=645 μm) is chosen for the support substrate 11. This 645 μm thick substrate is then molecular adhesion bonded, for example, to a 725 μm wafer, forming areas of lower mechanical strength. The 725 μm wafer is then thinned to the required thickness of 80 μm, for example by planning and chemical/mechanical polishing. The resulting assembly therefore corresponds to the standards and offers sufficient resistance to the processes for fabricating some or all of the components. After production of the latter, one of the separation techniques previously cited may be used (see FIG. 31, hydrofluoric acid etching and mechanical stresses), except that the substrate 16 can be omitted. Its presence can be beneficial in some cases, however. After separation, the self-supporting layer 14 alone represents the final substrate of interest, characterized by a substrate thickness of 80 μm, including the components. The remainder of the substrate can be recycled.

If required, the dies can be cut before separation, as is clear from FIGS. 33 and 34: FIG. 33 shows cuts between the components, extending to just below the future separation region, and FIG. 34 shows a pull-off support SA bonded to one of the fragments and adapted to allow pulling off after hydrofluoric acid etching, if any.

The weakening parameters have to be adapted to the technological operations that have to be carried out on the separable substrate prior to separation, in particular thermal and chemical treatments, and according to the nature of the mechanical stresses. For example, if the separable substrate consists of a surface layer of germanium having an $SiO_2$—$SiO_2$ bonding interface that has to withstand an epitaxial growth temperature of 550° C. (which is typical in the case of growing GaInAs to constitute a solar cell for use in space), then the rms roughness must advantageously be 0.4 nm for the substrate to be separable.

Another example of use concerns the production of circuits for smart cards, where the flexibility of the support becomes critical, firstly because of the increase in the size of the circuits, and secondly because the trend is to require cards with ever higher resistance to deformation. A monocrystalline silicon support whose thickness is greater than around 50 μm is too fragile in this context, because its thickness is too high if it is subjected to a bending force, as can happen regularly with a smart card.

FIG. 35 shows a starting assembly similar to that shown in FIG. 4, with a starting substrate 11' covered with a layer 12' of silicon oxide that is molecular adhesion bonded to a second layer 13' of silicon oxide, in turn covered with a silicon layer 14'. The circuits are produced within the silicon layer 14'. Then, for assembly to the second support 16' (see FIG. 36), an adhesive is preferably chosen that produces a very thin layer 15', whilst having the highest possible mechanical strength at low temperature, for example less than 400° C., so as not to risk damaging the components of the active layer produced after this bonding step. These can advantageously be adhesives hardened by heat or by exposure to UV radiation (in this latter case, it is sufficient to choose a final substrate 16' that is transparent to UV).

When it comes to cutting along the weakened area of the separable substrate (here the bonding interface 12'/13'), it may appear difficult to produce purely chemical lift-off because adhesives and substrates transparent to UV (in practice made of quartz and glass) are not totally inert to the chemical products (hydrofluoric acid, solvents, and the like). On the other hand, a purely mechanical action may be sufficient to lift off the structure at the weak interface 12'/13' if the bonding energy of the ring is lower than the strength of the adhesive and the various layers constituting the integrated circuits (this can be achieved relatively easily). It is then possible to use the substrate of the separable substrate several times. Apart from limited chemical etching of the ring, it is further possible to eliminate the ring by making a circular cut in the structure after adhesive bonding. The cutting can advantageously be effected by a laser at the boundary between the high bonding energy region and the low bonding energy region. If the ring is only a few mm wide, or even narrower, it is then possible to reuse the substrate.

As a general rule, the residue of the first substrate is obtained, the support of the substrate referred to until now as "separable" (see FIG. 37) and reusable, preferably after polishing the layer 12' and the active layer 14' (FIG. 38) that is transferred onto the other support 16' or alternatively is free and self-supporting if the thickness of the layer 14' is appropriate.

Unlike the preceding examples, the second substrate 16' can instead be merely an intermediate substrate in a much longer process that will continue either with the pure and simple elimination of the intermediate substrate 16' or another layer transfer operation onto a yet further support, generally involving elimination of the substrate 16'. The separable substrate obtained with the aid of the technique previously described is bonded to the intermediate substrate after it has been "processed". The intermediate substrate can be rigid or flexible (see the above examples). If it is rigid, it can even be a silicon wafer.

The use of adhesive films known to the person skilled in the art can be envisaged for the adhesive bonding, in particular for the operations of cutting silicon wafers and encapsulating integrated circuits or packaging or back-ending ("Blu Tak", Teflon® adhesive film, and the like). If the adhesive film is double-sided, it may be as well to stick an intermediate substrate to the rear face of the film, to act as a substrate or support for stiffening the assembly at cutting time.

The lift-off techniques that can be envisaged include the application of traction and/or shear and/or bending forces. It may be as well to combine the application of force with chemical etching of the interface, or other means, such as ultrasound. If the interface to be lifted off is of the oxide type, etching the low energy interface makes it easier for the bonding interface to yield and therefore facilitates the transfer of the processed layer to the intermediate substrate. Under these conditions, it is advantageous for the processed layers to be protected (for example by an additional deposit of nitride in the case of hydrofluoric acid etching).

Stresses can be applied directly to the thin film or to the intermediate substrate (known as a handle). They can be mechanical stresses (in particular applied by inserting a blade at the bonding interface), and/or use a lift-off tool (see WO 00/26000), and/or a jet, or involve inserting a gas flow, as described in the document FR 2796491, and/or a liquid (see EP 0925888, EP 0989593). In the case of a gas flow (or even a liquid flow, for example a flow of hydrofluoric acid if the interface is of oxide), the separable substrate can advantageously be prepared beforehand (for example by chemical etching) to feed the fluid locally to the bonding interface. This facilitates preferential lifting off at the multilayer structure bonding interface, where the lifting off must take place, by protecting the various layers of the structure incorporating the components. Thus it is possible to lift off the bonding interface even when the adhesion between the internal component layers is weak. In this regard, see FIGS. 39 and 40.

The intermediate substrate, which is sometimes referred to as a "handle", can then be cut, totally or in part (to form notches or cutting precursors), into elements corresponding to the electronic components, which can be transferred to different supports. The transfer can be collective, in which case all of the components, even if they are interconnected only by a support, are transferred at the same time in the same technological operation, or component by component (or die by die), if the latter are transferred one after the other. The supports can be of plastics material, as in the case of a smart card, and in this case an adhesive is advantageously used for the transfer. The elements can also be transferred onto a wafer incorporating other electronic or opto-electronic devices, in which case the transfer can again use a molecular adhesion technique (see FIGS. 4 and 19 to 22, imagining the additional presence of components formed in the layer 14). The elements can be transferred by conventional means such as pick and place means. The elements can also be transferred onto another support to improve the thermal properties, for example.

Then, by applying stress or localized heating (for example using a laser), the thin layer, previously bonded to its final support, can be separated (element by element, or globally) from its handle by means of mechanical forces.

As indicated with reference to FIGS. 17 and 18, the regions $Z_1$ and $Z_2$ may not define a system comprising a central circular region $Z_1$ surrounded by an outer ring $Z_2$. A multitude of other structures can be envisaged. The array of squares in FIG. 18 can be replaced by arrays of other shapes (rows, columns, concentric circles, and the like) whose pitch and other geometrical dimensions can vary as a function of the application and the separation technique employed. The benefit of adopting an array may prove to be preferable if the structure to be produced imposes high mechanical stresses that are transmitted to the connecting interface (in this case short-range repetition of areas of good mechanical strength is preferable), or if the layer 14 may feature holes, whether intentional or otherwise, locally uncovering the connecting region, which may in turn be subject to untimely delamination whose epicenter is the hole, or to simplify the method (for example for cutting into individual dies) in the case of producing dies. In principle, dimensions of the order of 1 µm are preferred for structures having to withstand high stresses (for example hetero-epitaxy or any other deposition or technological step applying significant tension or compression to the structure), or in the case of small circuits, or of circuits produced with submicron photolithographic resolution. In the contrary situation, scales of the order of 1 mm or even 1 cm are preferable. Many combinations of more than two regions can of course be envisaged ($Z_1$; $Z_2$, $Z_3$, and so on). Rather than a discrete number of types of regions of particular mechanical strength, a continuum of regions characterized by a continuous variation of the mechanical strength can be envisaged. For example, the mechanical strength decreasing continuously from a maximum value in the vicinity of the edge to a minimum value at its center can be envisaged. The variation can optionally be circularly symmetrical about an axis perpendicular to the plane of the substrate. Production processes yielding this type of substrate and their use in separation are in all respects similar to those described with reference to FIGS. 1 to 8, provided that the geometrical shapes employed are suitable (mask shapes for formation of protection layers for selective roughness, mask shapes for selective deposition, shape of polishing tissues for preferentially polishing eccentric rings, and the like).

The above geometrical shapes are compatible with the transfer of a layer 14 as a whole from the separable original substrate 11+12+13+14 to the target substrate 16.

Figure 41:
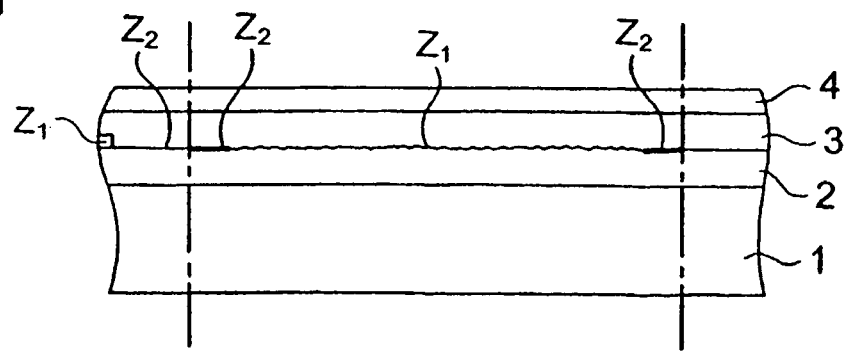
FIG. 41 is a view of a larger scale of an assembly including interleaved regions $Z_1$ and $Z_2$.

As opposed to embodiments of the method according to the invention that tend to encourage separation of the layer from its substrate at the global level, i.e. on the scale of the whole of the substrate, others tend to delimit fragments, the shape of which is clearly related to the dies or components to be produced from the active layer. FIG. 41 shows one example of this, with enlargement of the region that subsequently accommodates the die (or any other component). This structure can be repeated as many times as there are components to be separated on the original substrate. Ideally, each region $Z_2$ surrounds or simply extends along the contour of each fragment of the region $Z_1$. The surface area of the component (or die, or the like) can correspond exactly to the region $Z_1$, or be greater than or less than the latter, in configurations where one of the surfaces of the component and of the region $Z_1$ encompasses the other. The configuration adopted depends on the separation technique to be used, which can be the same as those previously described for separating a substrate having only a ring $Z_2$ around a central disc $Z_1$. One interesting variant consists in using conventional component cutting techniques (sawing, laser cutting, and the like) to cut or delimit trenches, at least partially around dies, fragments, and the like. Another beneficial variant is based on the use of chemical etching associated with a photolithography operation to produce identical trenches and/or to remove the connecting region corresponding to the region $Z_2$. As FIG. 41 shows in the case of one particular example, the vertical dashed lines indicate the contour of the required fragments. For example, after preparing molecular adhesion bonding over a large area, only layers 3 and 4 are cut to the contour shown, after which each fragment is lifted off the substrate 1, which amounts to considering that the substrate is lifted off each fragment (as an alternative, all the layers or all of the fragments can be cut at one and the same time). To the extent that, after cutting, the high mechanical strength region is at the periphery, the risk of delamination during treatment steps, for example to produce electronic, optical or other components on the layers 3 or 4, is reduced, whereas, when lifting off is required, it propagates without difficulty, in a controlled manner, in the central region (it may have been initiated at the periphery).

Combining the distribution of the regions $Z_1$ and $Z_2$ with the aim of forming an outer ring at the level of the substrate, as shown in FIG. 4, with a distribution intended to protect each of the dies, as shown in FIG. 13, is one beneficial combination.

Of course, the embodiments previously described are not limited to the single case of monocrystalline silicon, and can be extended to many materials, such as other semiconductor materials (Ge, SiGe, SiC, GaN and other equivalent nitrides, AsGaInP, and the like), ferro-electric and piezo-electric materials (LiNbO$_3$, LiTaO$_3$), and "treated" magnetic materials, whether components are produced before separation or not.

As already mentioned, for the situation of a separable substrate consisting of a surface layer of germanium having an SiO$_2$—SiO$_2$ bonding interface that has to be subjected to an epitaxial growth temperature of 550° C. (as is typical in the case of growing GaInAs to constitute a solar cell for use in space), then the root mean square (rms) roughness should advantageously be 0.4 nm for the substrate to be separable.

Figure 42:
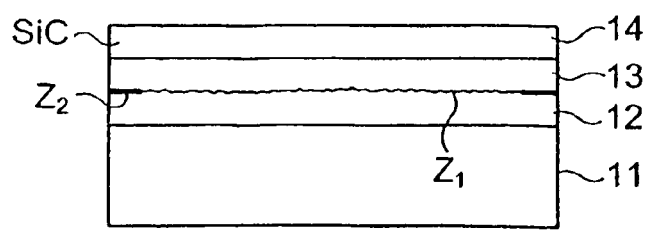
FIG. 42 is a view of an assembly analogous to that of FIG. 4.
Figure 43:
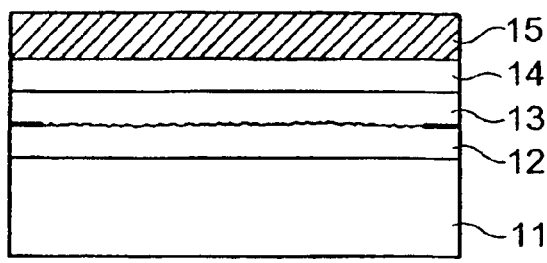
FIG. 43 illustrates the assembly of FIG. 42 after deposition of an epitaxial stack based on GaN.
Figure 44:
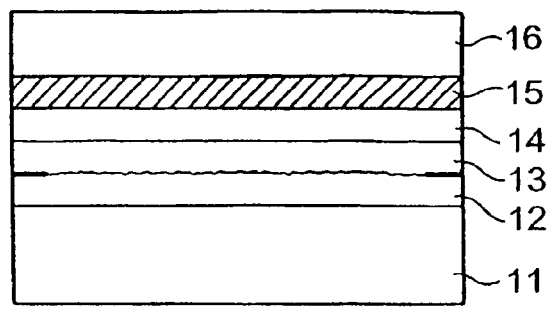
FIG. 44 illustrates the assembly of FIG. 43 after bonding a substrate.
Figure 45:
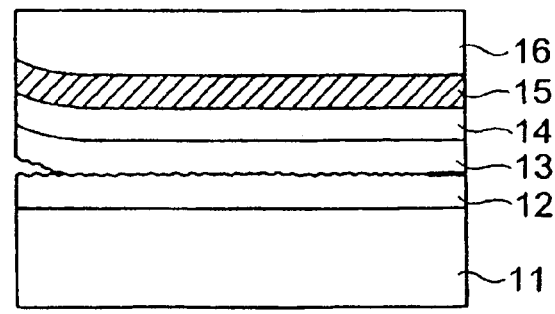
FIG. 45 illustrates the assembly of FIG. 44 at the time of lifting off.
Figure 46:
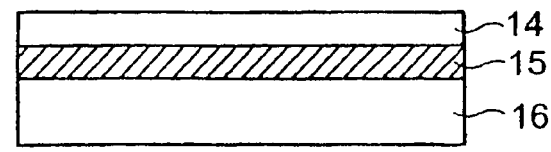
FIG. 46 is a view of the upper portion of the assembly illustrated in FIG. 45 after polishing.
Figure 47:
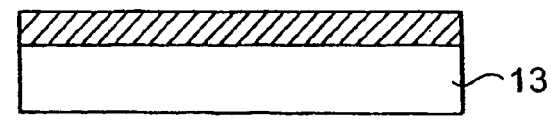
FIG. 47 illustrates the assembly of FIG. 45 after removal of the layer under the stack.

Another example is that of epitaxially growing an epitaxial stack on a separable substrate. This applies in particular to the production of blue and white LEDs and thin layer laser diodes (for example, for improved extraction of the light emitted or improved evacuation of heat, thanks to transfer onto a substrate that is a good conductor of heat, such as copper or diamond). In this case, the epitaxial stack concerned is based on composite semiconductors derived from GaN (AlN, GaAlN, GaAlInN, and the like). One method consists of using one of the processes previously described to form a separable structure equivalent to that of FIG. 4 (or FIG. 26 or FIG. 35) in which the layer 14 is of SiC (the transferred Si face is at the top in the figures), the layers 12 and 13 are of silicon oxide, as in the FIG. 4 example, and the substrate 11 is of polycrystalline SiC (or sapphire). The stack 15" based on nitrides (FIG. 43) is grown epitaxially on this structure (FIG. 42). The epitaxial techniques used can be those well known to the person skilled in the art such as molecular beam epitaxy (MBE) for one category, and metallo-organic chemical vapor deposition (MOCVD) for another category. In the former case, the epitaxial growth temperatures rarely exceed 600° C., whereas the typical temperatures for the second category are of the order of 1050° C. to 1100° C. For each of the above two techniques, the choice of the pairs or sets of regions $Z_1$, $Z_2$, etc. must be optimized. In the second case, one of the processes previously described based on roughening of the two oxide layers 12 and 13 by hydrofluoric acid etching is chosen, for example, and another variant consists in forming a 5 mm wide ring from the edge of the substrate. Subsequent MOCVD epitaxial growth at 1100° C. produces a stack whose thickness is of the order of 1 μm. The structure is optionally annealed before the epitaxial growth stage, typically in the temperature range from 900° C. to 1200° C., in order to consolidate strongly the mechanical strength of the ring. After the growth step, the assembly is subjected to deposition of oxide, planarization by CMP, molecular adhesion bonding (for example onto a silicon substrate), and annealing at 1100° C. to strength this latter bonding. and the layer 16 is produced (FIG. 44). Finally, there is separation at the bonding interface (FIG. 45). A few hours in a 50% hydrofluoric acid bath are sufficient to etch the oxide layer laterally to a depth of a few mm where this interface corresponds to the region $Z_2$, thereby uncovering the region $Z_1$. This is followed by separation by means of mechanical forces, for example by inserting a blade (not shown), applying a pressurized water jet, or applying a compressed air jet, using the techniques previously described, for example. A final deoxidation step removes the residue of the oxide layer 13 (FIG. 46). At last the SiC layer 14 that served as a nucleation layer for the epitaxial stack can optionally be eliminated by etching (FIG. 47). Diodes can be produced before or after the final transfer.

2—Weak Buried Layer Incorporating Microcavities, Microbubbles or Platelets

The interface between the substrate and what is to form the "active" layer can instead take the form of a buried weak layer, formed of microcavities, microbubbles, or platelets, for example. This process can be used with many semiconductor and other materials.

The difference between regions with different mechanical strengths is obtained by different levels of weakening; in the case where, as in FIGS. 1 to 3, a central region is required to be surrounded by a peripheral region of greater mechanical strength, it is sufficient to weaken the structure less at the periphery than at the center, for example, by introducing at the periphery smaller amounts of the substances for weakening the region (for example by hydrogen implantation); this can be obtained by masking a portion of the layer during a portion of the implantation operation, for example, or by modifying the sweep during implantation; it can also be achieved by carrying out successive implantations, under different conditions, in the various regions whose properties are to be different. Regions can also be weakened differently by applying different heat treatments to them to obtain different levels of weakening.

With regard to the distribution of the regions $Z_i$ and $Z_2$ (a single ring, fragments, array of regions, multitude of regions, and the like), the techniques for separating these structures (by means of mechanical stresses, chemical treatment, heat treatment, selective removal of rings and regions $Z_2$, and the like) and how they are reduced to practice, the elements and examples given in section 1 relating to an interface or intermediate layer produced by molecular adhesion remain valid.

3—Interface Formed of a Porous Layer

The person skilled in the art knows, in particular from the document EP 0843346A2, that a porous layer can be obtained from the following materials in particular: Si, GaAs, InP, GaAsP, GaAlAs, InAs, AlGaSb, ZnS, CdTe and SiGe, in monocrystalline, polycrystalline or amorphous forms.

Thus it is only by way of example that the remainder of this description refers to silicon.

It is possible to obtain porous silicon by electrolysis in hydrofluoric acid. The person skilled in the art knows how to vary the porosity of the Si by modifying the concentration of the hydrofluoric acid or by varying the current. For example, reducing the hydrofluoric acid concentration from 50% to 20% changes the porosity from 2.1 g/cm$^3$ to 0.6 g/cm$^3$.

Thus by protecting the outer ring of the Si wafer with a thick deposit (of nitride, oxide or polycrystalline silicon, for example) it is possible to make a central region of the silicon layer porous whilst preserving the periphery intact. It then suffices to eliminate the layer deposited at the periphery and to electrolyze the entire wafer. The consequence of these two electrolysis operations is to produce a higher porosity at the center of the wafer than at the periphery.

Figure 48:
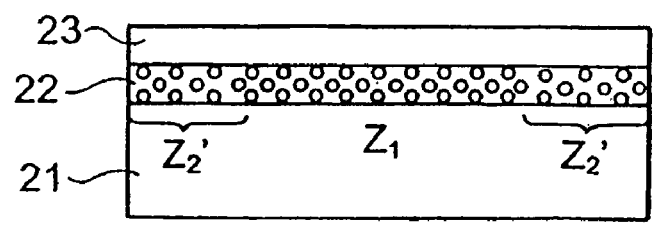
FIG. 48 is a view of a substrate including a buried weak layer.

A monocrystalline layer of Si is then produced on this porous layer by epitaxial growth (see FIG. 48, which represents a structure comprising a substrate 21, the porous layer 22, having controlled differences in porosity between the regions $Z_1'$ and $Z_2'$, and a thin layer 23). Smoothing annealing of the hydrogen annealing type is advantageously employed before the epitaxial growth step to stop up the surface of the pores at least in part.

There can be crystal lattice continuity between the various layers if they have the same constituent.

The thickness of this monocrystalline layer, which thus becomes the active layer, depends on the intended applications.

Depending on the thickness of the active layer, after separation it can become a self-supporting layer (if it is relatively thick) or it can be transferred to a target substrate (for example by molecular adhesion), especially if the layer is thin. The active layer can be lifted off its substrate by chemical means or by introducing a fluid locally into the porous layer.

Figure 49:
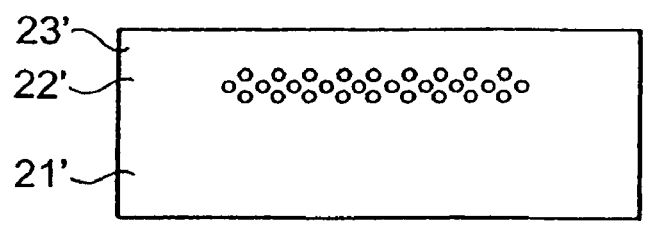
FIG. 49 is a view of a substrate including a buried weak layer portion.

An alternative is to render the periphery porous only to a distance of a few mm (as in FIG. 49, with a substrate 21', a layer 22', some regions of which are porous, and a monocrystalline layer 23'). It then becomes appropriate to eliminate this ring by cutting (by mechanical or laser cutting or by chemical processing using HF/HNO$_3$ or TMAH).

With regard to the distribution of the regions $Z_1$ and $Z_2$ (a single ring, fragments, array of regions, multitude of regions, etc.), the techniques for separating these structures (by mechanical stresses, chemical treatment, heat treatment, selective removal of rings and regions $Z_2$, etc.) and how they are reduced to practice, the elements and examples given in section 1 relating to an interface or intermediate layer produced by molecular adhesion remain valid.

In accordance with one or more of the various embodiments of the invention:

the interface can be a simple contact surface or a connecting layer, the fragments can be distributed in a network of squares, lines, concentric circles, etc., the geometrical definition of the fragments is preferably related to the location and the size of the dies (to the nearest region $Z_2$ or the nearest sawing line), the surface preparation step before bonding can include roughening of the oxide layer, the preparation before bonding can affect the roughness but also the hydrophilic properties, to obtain a greater roughness of the first region relative to that of the second region, both regions can be roughened and the roughness of only the second region reduced, the difference between $Z_1$, $Z_2$ can result from heat treatment after localized molecular bonding; alternatively, localized thermal annealing can be used after the bonding operation (laser beam, non-uniform furnace, heating by lamps, and the like), when the interface is a buried layer weakened by implanting a gaseous element, the latter preferably remains gaseous, to obtain lift-off, portions of material corresponding to the region $Z_2$ can advantageously be eliminated by chemical etching and/or by mechanical removal of material (machining), the lift-off step can be effected by etching in a vacuum and/or application of stresses; a jet of water, air or pressurized fluid can be used, the preceding description has emphasized a silicon layer, but SiC, GaN, GaAs, InP, SiGe and semiconductors derived therefrom are also relevant, there can be a step of epitaxial growth on the layer before separation; likewise components can be produced completely or in part before separation, there can be regions $Z_3$, and even $Z_4$, having levels of mechanical strength different from those of the regions $Z_1$ and $Z_2$, there can be a continuous evolution of the mechanical strength between extreme values, rather than in plateaux linked by discrete steps, the difference in mechanical strength between the regions can result from a difference of composition (interface formed of a layer with one region of one material and the other region of another material, or an interface formed in part by the material of the substrate or the layer and in part by a transferred layer).

The invention claimed is:

1. A method of preparing a thin layer carrying at least a part of a device, the method comprising:
   providing a substrate having a surface;
   providing a layer configured to form at least a part of the thin layer and having a first surface and a second surface opposite to the first surface;
   applying a surface treatment to at least one of the surface of the substrate or the first surface of the layer;
   forming a detachable bonded interface between the surface of the substrate and the first surface of the layer, wherein the surface treatment is applied so as to create within the bonded interface, a first interface region and a second interface region surrounding the first interface region, the first interface region having a first level of mechanical strength which is greater than zero, and the second interface region having a second level of mechanical strength significantly greater than the first level of mechanical strength; and
   forming at least a part of a device on the second surface of the layer,
   wherein the first and second levels of mechanical strength are sufficient to prevent the interface from detaching during this step, and
   whereby the thin layer and the substrate may be subsequently detached at the bonded interface.

2. A method according to claim 1, wherein the substrate comprises a wafer having a wafer periphery surrounding a wafer core and wherein the second interface region includes the wafer periphery and the first interface region includes the wafer core.

3. A method according to claim 1, wherein forming a detachable bonded interface includes a step of preparing both the surface of the substrate and the first surface of the layer.

4. A method according to claim 1 further comprising a step of detaching the layer from the substrate at the detachable bonded interface subsequent to forming at least a part of the device.

5. A method according to claim 4, wherein the method further comprises, between the step of forming the detachable bonded interface and the step of detaching the layer from the substrate, a step of cutting at least the layer between the second interface region and the first interface region.

6. A method according to claim 4 wherein forming at least a part of a device comprises producing at least a part of a plurality of microelectronic, optical or mechanical components in a plurality of zones of the second surface of the layer that face the first interface region and followed by dividing the layer into parts each comprising one of the plurality of components, and wherein detaching the layer is carried out part by part.

7. A method according to claim 4, wherein the method further comprises between the step of forming the detachable bonded interface and detaching the layer, a bonding step during which the second surface of the layer is bonded to a second substrate.

8. A method according to claim 1, wherein the first interface region comprises a plurality of interface fragments surrounded by the second interface region, and wherein forming at least part of a device comprises producing at least a part of a plurality of microelectronic, optical or mechanical components in a plurality of zones each opposite to a respective interface fragment of the first interface region of low mechanical strength and surrounded by the second interface region of higher mechanical strength.

9. A method according to claim 1, wherein forming a detachable bonded interface comprises one of direct bonding or molecular adhesion bonding.

10. A method according to claim 9 wherein applying a surface treatment includes a treatment step of locally increasing the roughness of the at least one surface in a zone forming part of the first interface region after bonding.

11. A method according to claim 10, wherein the treatment step comprises localized acid etching of the at least one surface in the zone forming part of the first interface region.

12. A method according to claim 11, wherein the localized acid etching comprises etching with hydrofluoric acid, wherein a zone of the at least one surface forming part of the second interface region is protected from etching by a nitride layer, and wherein the method further comprises eliminating the nitride layer after etching.

13. A method according to claim 9, wherein applying a surface treatment comprises a step in which the at least one surface is roughened entirely and a step in which the roughness of at least a zone forming part of the first interface region is reduced to obtain greater bonding forces.

14. A method according to claim 13, wherein the roughness of the zone is reduced by one or more of chemical polishing, mechanical treatment, chemical-mechanical treatment, or dry etching.

15. A method according to claim 1, wherein forming a detachable bonded interface comprises adhesive bonding.

16. A method according to claim 15, wherein the adhesive bonding comprises bonding with an adhesive that is hardened by UV radiation.

17. A method according to claim 1, wherein providing a layer comprises providing a continuous layer.

18. A method according to claim 17, wherein providing a layer comprises providing a monocrystalline silicon layer.

* * * * *